(12) United States Patent
Xiao et al.

(10) Patent No.: US 12,426,251 B2
(45) Date of Patent: Sep. 23, 2025

(54) SEMICONDUCTOR STRUCTURE, METHOD FOR MANUFACTURING SEMICONDUCTOR STRUCTURE, AND MEMORY

(71) Applicant: CHANGXIN MEMORY TECHNOLOGIES, INC., Hefei (CN)

(72) Inventors: Deyuan Xiao, Hefei (CN); Guangsu Shao, Hefei (CN); Weiping Bai, Hefei (CN); Yunsong Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 502 days.

(21) Appl. No.: 18/095,292

(22) Filed: Jan. 10, 2023

(65) Prior Publication Data

US 2023/0413528 A1 Dec. 21, 2023

Related U.S. Application Data

(63) Continuation of application No. PCT/CN2022/108167, filed on Jul. 27, 2022.

(30) Foreign Application Priority Data

Jun. 21, 2022 (CN) .......................... 202210707466.X

(51) Int. Cl.
H10B 12/00 (2023.01)
(52) U.S. Cl.
CPC .......... H10B 12/33 (2023.02); H10B 12/036 (2023.02); H10B 12/05 (2023.02); H10B 12/482 (2023.02)

(58) Field of Classification Search
CPC ...... H10B 12/036; H10B 12/05; H10B 12/33; H10B 12/482
See application file for complete search history.

(56) References Cited

U.S. PATENT DOCUMENTS

| 5,571,730 A | 11/1996 | Park |
| 2005/0285176 A1 | 12/2005 | Kim |
| 2008/0035976 A1 | 2/2008 | Kim |

(Continued)

FOREIGN PATENT DOCUMENTS

| CN | 1767199 A | 5/2006 |
| CN | 101874303 A | 10/2010 |

(Continued)

*Primary Examiner* — Edward Chin
(74) *Attorney, Agent, or Firm* — SYNCODA LLC; Feng Ma

(57) ABSTRACT

A semiconductor structure, a method for manufacturing a semiconductor structure, and a memory are provided. The semiconductor structure includes a substrate, a plurality of active pillars arranged above the substrate, a storage structure, and a plurality of transistors. The active pillars are arranged in an array in a first direction and in a second direction. Each active pillar includes a first sub active pillar and a second sub active pillar arranged on the first sub active pillar. The first direction and the second direction intersect with each other and are both parallel to a top surface of the substrate. A material of the first sub active pillar includes a first element, and resistivity of the first sub active pillar including the first element is less than resistivity of the first sub active pillar absence of the first element. The storage structure covers a sidewall of the first sub active pillar.

17 Claims, 16 Drawing Sheets

(56) References Cited

U.S. PATENT DOCUMENTS

| | | |
|---|---|---|
| 2010/0295110 A1 | 11/2010 | Takaishi |
| 2011/0244302 A1 | 10/2011 | Wasson |
| 2012/0156844 A1* | 6/2012 | Kim .................... H10D 64/687 |
| | | 438/270 |
| 2013/0148260 A1 | 6/2013 | Wasson |
| 2013/0234240 A1 | 9/2013 | Moon et al. |
| 2014/0035018 A1 | 2/2014 | Lee |
| 2015/0001617 A1 | 1/2015 | Kim et al. |
| 2015/0348976 A1 | 12/2015 | Moon et al. |
| 2018/0308923 A1 | 10/2018 | Wu et al. |
| 2019/0103407 A1 | 4/2019 | Kim et al. |
| 2019/0189617 A1 | 6/2019 | Kim et al. |
| 2019/0206982 A1 | 7/2019 | Wu et al. |
| 2019/0252387 A1 | 8/2019 | Moon et al. |
| 2019/0273081 A1 | 9/2019 | Moon et al. |
| 2020/0111793 A1 | 4/2020 | Kim et al. |
| 2020/0243532 A1 | 7/2020 | Kim et al. |
| 2021/0057416 A1 | 2/2021 | Kim et al. |
| 2021/0066306 A1 | 3/2021 | Tang et al. |
| 2021/0151440 A1 | 5/2021 | Tang et al. |
| 2021/0202485 A1* | 7/2021 | Inaba .................... H10B 12/05 |
| 2021/0202490 A1 | 7/2021 | Cho et al. |
| 2022/0052151 A1 | 2/2022 | Wang |
| 2022/0173109 A1 | 6/2022 | Rigano |
| 2022/0246621 A1 | 8/2022 | Cho et al. |

FOREIGN PATENT DOCUMENTS

| | | |
|---|---|---|
| CN | 103311249 A | 9/2013 |
| CN | 108735744 A | 11/2018 |
| CN | 109065501 A | 12/2018 |
| CN | 109616474 A | 4/2019 |
| CN | 113078116 A | 7/2021 |
| CN | 113611671 A | 11/2021 |
| CN | 113707614 A | 11/2021 |
| CN | 114068414 A | 2/2022 |
| CN | 114078777 A | 2/2022 |
| CN | 114093821 A | 2/2022 |
| CN | 114256240 A | 3/2022 |
| CN | 114342065 A | 4/2022 |
| CN | 114373764 A | 4/2022 |
| CN | 114651450 A | 5/2022 |
| CN | 114582808 A | 6/2022 |
| JP | H0864777 A | 3/1996 |
| JP | 2013168570 A | 8/2013 |

* cited by examiner

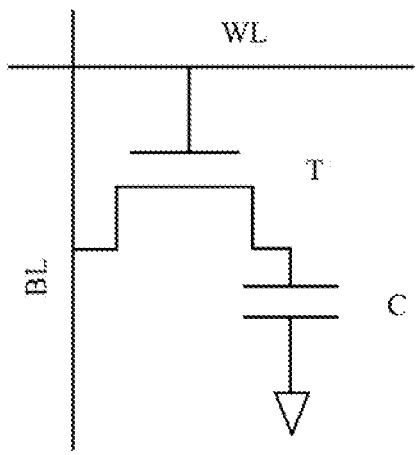

FIG. 1

A substrate is provided, and a plurality of active pillars arranged in an array in a first direction and in a second direction are formed on the substrate, in which each of the plurality of active pillars includes a first sub active pillar and a second sub active pillar arranged on the first sub active pillar, and the first direction and the second direction intersect with each other and are both parallel to a top surface of the substrate — S201

A first element is added into the first sub active pillar, in which resistivity of the first sub active pillar including the first element is less than resistivity of the first sub active pillar absence of the first element — S202

A storage structure is formed at least on a sidewall of the first sub active pillar — S203

A plurality of transistors are formed, in which a channel structure of each of the plurality of transistors is arranged in the second sub active pillar, and an extending direction of the channel structure is the same as an extending direction of the second sub active pillar — S204

FIG. 2

SEMICONDUCTOR STRUCTURE, METHOD FOR MANUFACTURING SEMICONDUCTOR STRUCTURE, AND MEMORY

CROSS-REFERENCE TO RELATED APPLICATIONS

This is a continuation application of International Patent Application No. PCT/CN20221108167, filed on Jul. 27, 2022, which claims priority to Chinese Patent Application No. 202210707466.X, filed on Jun. 21, 2022, the contents of which are incorporated herein by reference in its entirety.

BACKGROUND

The storage array architecture of a Dynamic Random Access Memory (DRAM) is an array composed of a memory cell including one transistor and one capacitor (that is, 1T1C memory cell). A gate of the transistor is connected to a word line, a drain of the transistor is connected to a bit line, and a source of the transistor is connected to the capacitor.

As the size of the DRAM is continuously reduced, the size of the memory cell is also reduced. Therefore, how to ensure the performance of the memory cell in the DRAM has become an urgent problem to be solved.

SUMMARY

The disclosure relates to, but is not limited to, a semiconductor structure, a method for manufacturing a semiconductor structure, and a memory.

A first aspect of the disclosure provides a semiconductor structure, which includes a substrate, a plurality of active pillars arranged above the substrate, a storage structure, and a plurality of transistors.

The plurality of active pillars are arranged in an array in a first direction and in a second direction. Each of the plurality of active pillars includes a first sub active pillar and a second sub active pillar arranged on the first sub active pillar. The first direction and the second direction intersect with each other and are both parallel to a top surface of the substrate. A material of the first sub active pillar includes a first element, and resistivity of the first sub active pillar including the first element is less than resistivity of the first sub active pillar absence of the first element.

The storage structure covers a sidewall of the first sub active pillar.

A channel structure of each of the plurality of transistors is arranged in the second sub active pillar, and an extending direction of the channel structure is the same as an extending direction of the second sub active pillar.

A second aspect of the disclosure provides a memory, which includes one or more semiconductor structures. Each semiconductor structure includes a substrate, a plurality of active pillars arranged above the substrate, a storage structure, and a plurality of transistors.

The plurality of active pillars are arranged in an array in a first direction and in a second direction. Each of the plurality of active pillars includes a first sub active pillar and a second sub active pillar arranged on the first sub active pillar. The first direction and the second direction intersect with each other and are both parallel to a top surface of the substrate. A material of the first sub active pillar includes a first element, and resistivity of the first sub active pillar including the first element is less than resistivity of the first sub active pillar absence of the first element.

The storage structure covers a sidewall of the first sub active pillar.

A channel structure of each of the plurality of transistors is arranged in the second sub active pillar, and an extending direction of the channel structure is the same as an extending direction of the second sub active pillar.

A third aspect of the disclosure provides a method for manufacturing a semiconductor structure, which includes the following operations.

A substrate is provided, and a plurality of active pillars arranged in an array in a first direction and in a second direction are formed on the substrate, in which each of the plurality of active pillars includes a first sub active pillar and a second sub active pillar arranged on the first sub active pillar, and the first direction and the second direction intersect with each other and are both parallel to a top surface of the substrate.

A first element is added into the first sub active pillar, in which resistivity of the first sub active pillar including the first element is less than resistivity of the first sub active pillar absence of the first element.

A storage structure is formed at least on a sidewall of the first sub active pillar.

A plurality of transistors are formed, in which a channel structure of each of the plurality of transistors is arranged in the second sub active pillar, and an extending direction of the channel structure is the same as an extending direction of the second sub active pillar.

BRIEF DESCRIPTION OF THE DRAWINGS

FIG. 1 is a schematic diagram of circuit connection of a DRAM transistor according to an embodiment of the disclosure;

FIG. 2 is a flowchart of a method for manufacturing a semiconductor structure according to an embodiment of the disclosure.

Figure 3:
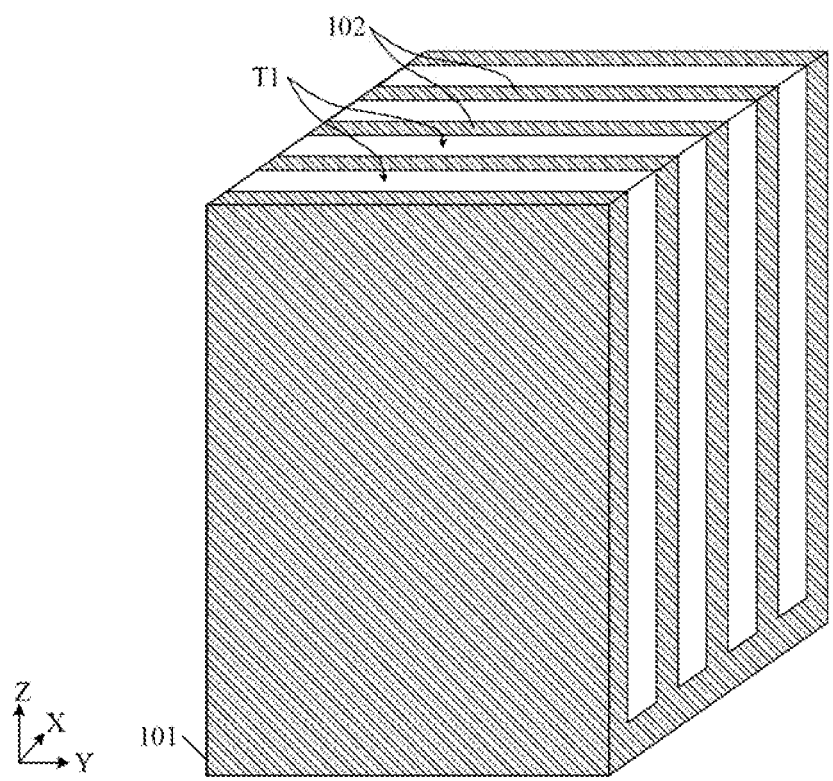
FIG. 3 to FIG. 31 are schematic diagrams of three-dimensional structures in a process for manufacturing a semiconductor structure according to an embodiment of the disclosure.

In the accompanying drawings (which are not necessarily drawn to scale), similar reference numerals may denote similar components in different diagrams. The similar reference numerals having different letter suffixes may denote different examples of similar components. The accompanying drawings generally illustrate various embodiments discussed in the disclosure by way of example and not by way of limitation.

DETAILED DESCRIPTION

In order to make technical solutions and advantages of the embodiments of the disclosure clearer, the technical solutions of the disclosure will be further described in details below with reference to the accompanying drawings and embodiments. Although the exemplary implementations of the disclosure are shown in the accompanying drawings, it should be understood that the disclosure may be implemented in various forms and cannot be limited by the implementations illustrated herein. On the contrary, the implementations are provided to more thoroughly understand the disclosure and to completely convey the scope of the disclosure to those skilled in the art.

The disclosure is described more specifically by way of example in the following paragraphs with reference to the accompanying drawings. The advantages and features of the present disclosure will become apparent in light of the following descriptions and claims. It should be noted that the accompanying drawings are provided in a very simplified form not necessary drawn to exact scale, and are only intended to facilitate convenience and clarify in explaining the embodiments of the present disclosure.

It may be understood that the meanings of "on . . ." "over" and "above" in the present disclosure should be read in the broadest manner, so that "on . . . " not only means that it is "on" something without any intervening features or layers therebetween (i.e., directly on something), but also includes the meaning of being "on" something with intervening features or layers therebetween.

In addition, for the convenience of description, spatial relative terms such as "on", "above", "over", "top" and "upper" may be used herein to describe a relationship of one element or feature and another element or feature as shown in the figures. In addition to the orientations shown in the figures, the spatial relative terms are intended to include different orientations of the devices in use or operation. The device may be otherwise oriented (rotated by 90 degrees or in other orientations) and the spatial relative descriptors used herein may also be explained accordingly.

In the embodiments of the disclosure, the term "substrate" refers to a material on which subsequent material layers are added. The substrate itself may be patterned. The material added on the top portion of the substrate may be patterned or may remain unpatterned. In addition, the substrate may include various semiconductor materials, such as silicon, silicon germanium, germanium, arsenide, indium phosphide, etc. Alternatively, the substrate may be made of a non-conductive material, such as glass, plastic or sapphire wafers.

In the embodiments of the disclosure, the term "layer" refers to a portion of material that includes an area having a thickness. The layer may extend over the entirety of the structure below or above the layer, or may have an extent smaller than the extent of the structure below or above the layer. Moreover, the layer may be an area of homogeneous or inhomogeneous continuous structure having a thickness less than the thickness of the continuous structure. For example, the layer may be located between the top surface and the bottom surface of the continuous structure, or the layer may be arranged between any pairs of the horizontal faces at the top surface and bottom surface of the continuous structure. The layer may extend horizontally, vertically, and/or along an inclined surface. The layer may include a plurality of sub-layers. For example, the interconnection layer may include one or more conductor and contact sub-layers (in which interconnection wires and/or through-hole contacts are formed), and one or more dielectric sub-layers.

In the embodiment of the disclosure, the terms "first", "second" and the like are intended to distinguish similar objects but do not necessarily indicate a specific sequence or order.

A semiconductor structure involved in the embodiments of the disclosure is at least a part that will be used in the subsequent process to form the final device structure. Herein, the final device may include a memory. The memory includes, but is not limited to, a DRAM. The DRAM is only taken as an example for description below.

It should be noted that, the description about the DRAM in the following embodiments is only used for illustrating the disclosure, but not for limiting the scope of the disclosure.

With the development of the DRAM technology, the size of the memory cell becomes smaller and smaller, and its array architecture changes from 8 $F^2$ to 6 $F^2$ to 4 $F^2$. In addition, based on the requirements for ions and leakage current in the DRAM, the architecture of the memory changes from Planar Array Transistor to Recess Gate Array Transistor, from the Recess Gate Array Transistor to Buried Channel Array Transistor, and then from the Buried Channel Array Transistor to Vertical Channel Array Transistor.

In some embodiments of the disclosure, regardless of the planar transistor or the buried transistor, the DRAM is composed of a plurality of memory cells. The structure of each memory cell is mainly composed of one transistor and one memory cell (storage capacitor) controlled by the transistor. That is, the DRAM includes the architecture of one Transistor (T) and one Capacitor (C) (1T1C), and its main principle is to use the amount of charges stored in the capacitor to represent whether a binary bit is 1 or 0.

FIG. 1 is a schematic diagram of circuit connection using the 1T1C architecture according to an embodiment of the disclosure. As shown in FIG. 1, the drain of the transistor T is electrically connected to a Bit Line (BL), the source of the transistor T is electrically connected to one of the electrode plates of the capacitor C, the other one of the electrode plates of the capacitor C may be connected to a reference voltage which may be a ground voltage or other voltages, and the gate of the transistor T is connected to a Word Line (WL). The voltage is applied through the word line WL to control the transistor T to be turned on or turned off. The bit line BL is configured to perform a read or write operation on the transistor T when the transistor T is turned on.

However, in order to realize the development of memory miniaturization, the size of the DRAM is continuously reduced, and resistance between the capacitor and the transistor in the memory cell becomes larger and larger, which affects the signal transmission of the memory cell. Meanwhile, the size of the capacitor is reduced accordingly, which makes the process of aligning the capacitor with the transistor more and more difficult.

Based on this, in order to solve one or more of the above problems, an embodiment of the disclosure provides a method for manufacturing a semiconductor structure. FIG. 2 is a flowchart of a method for manufacturing a semiconductor structure according to an embodiment of the disclosure. As shown in FIG. 2, the method for manufacturing the semiconductor structure provided in the embodiment of the disclosure includes the following operations.

In S201, a substrate is provided, and a plurality of active pillars arranged in an array in a first direction and in a second direction are formed on the substrate, in which each of the plurality of active pillars includes a first sub active pillar and a second sub active pillar arranged on the first sub active pillar, and the first direction and the second direction intersect with each other and are both parallel to a top surface of the substrate.

In S202, a first element is added into the first sub active pillar, in which resistivity of the first sub active pillar including the first element is less than resistivity of the first sub active pillar absence of the first element.

In S203, a storage structure is formed at least on a sidewall of the first sub active pillar.

In S204, a plurality of transistors are formed, in which a channel structure of each of the plurality of transistors is arranged in the second sub active pillar, and an extending direction of the channel structure is the same as an extending direction of the second sub active pillar.

It should be understood that, the operations shown in FIG. 2 are not exclusive, and additional operations may also be performed before and after any operation or between any operations during operations. The sequence of the operations shown in FIG. 2 may be adjusted according to actual needs.

Here and hereinafter, the first direction and the second direction are two orthogonal directions that are parallel to the top surface of the substrate. The third direction is a direction perpendicular to the top surface of the substrate. That is to say, the third direction is the extending direction of the active pillar. The top surface of the substrate may be understood as a plane perpendicular to the extending direction of the active pillar.

In some embodiments, an included angle between the first direction and the second direction ranges from 0 to 90 degrees. In some specific embodiments, the first direction may be perpendicular to the second direction. It can be understood that, the included angle between the first direction and the second direction establishes a position relationship of the array arrangement of the semiconductor pillars in the first direction and in the second direction.

Exemplarily, the first direction is an X direction in the figures; the second direction is a Y direction in the figures; and the third direction is a Z direction in the figures.

FIG. 3 to FIG. 31 are schematic diagrams of three-dimensional structures in a process for manufacturing a semiconductor structure according to an embodiment of the disclosure. The method for manufacturing the semiconductor structure provided in the embodiment of the disclosure is further described in detail below with reference to FIG. 2, FIG. 3 to FIG. 31.

With reference to FIG. 3 to FIG. 14, S201 is performed, in which a plurality of active pillars are formed.

In some embodiments, the operation that the plurality of active pillars arranged in an array in the first direction and in the second direction are formed on the substrate includes the following operations.

Operation a. A plurality of semiconductor pillars arranged in an array in the first direction and in the second direction are formed on the substrate, in which each of the plurality of semiconductor pillars includes a first portion, a second portion arranged on the first portion, and a third portion arranged on the second portion.

Operation b. A support layer covering a top surface of the third portion is formed.

Operation c. A second protective layer covering at least a sidewall of the third portion is formed.

Operation d. Each of the plurality of semiconductor pillars is oxidized, so as to completely oxidize the first portion into an oxidation pillar, and to oxidize a surface of the second portion into an oxide layer.

Operation e. The oxide layer on the surface of the second portion is removed, so as to form the first sub active pillar.

Operation f. After the storage structure is formed, the support layer and the second protective layer are removed to form the second sub active pillar.

With reference to FIG. 3 to FIG. 6, the operation a is performed, in which the plurality of semiconductor pillars are formed.

In some embodiments, the operation that the plurality of semiconductor pillars arranged in an array in the first direction and in the second direction are formed on the substrate includes the following operations.

A semiconductor base is provided.

A plurality of first trenches spaced apart from each other and arrayed in the first direction and a plurality of second trenches spaced apart from each other and arrayed in the second direction are formed in the base.

A bottom portion of each of the plurality of first trenches and/or a bottom portion of each of the plurality of second trenches are/is expanded, so as to form the plurality of semiconductor pillars.

With reference to FIG. 3, a material of the semiconductor base 100 may include silicon (Si), germanium (Ge), silicon germanium (SiGe), etc.

With reference to FIG. 3, first etching is performed on a top surface of the semiconductor base 100 through a Lithography-Etch (LE) process, so as to form, in the semiconductor base, a plurality of first trenches T1 spaced apart from each other and arrayed in the first direction. Herein, each first trench T1 extends in the second direction. The semiconductor base 100 is divided into a plurality of semiconductor bars 102 by the first trenches T1.

Herein, the first trenches T1 are arranged in the semiconductor base. That is to say, a depth of the first trench T1 in the third direction is less than a thickness of the semiconductor base 100 in the third direction.

The first etching includes, but is not limited to, a dry plasma etching process.

In some embodiments, the first trench T1 includes, but is not limited to, a Shallow Trench Isolation (ST1) structure.

Figure 4:
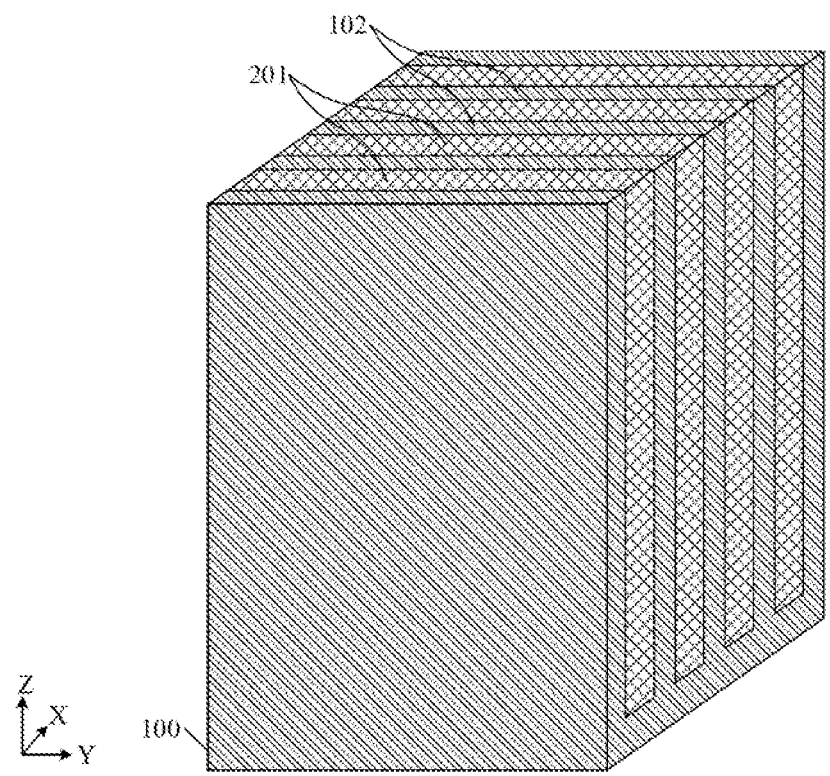

With reference to FIG. 4, a first insulation material 201 is formed in the first trenches T1. A top surface of the first insulation material 201 is substantially flush with a top surface of the semiconductor base 100. Herein, the first insulation material 201 is configured for supporting.

In some embodiments, a constituent material of the first insulation material 201 includes, but is not limited to, silicon oxide ($SiO_2$).

The method for forming the first insulation material 201 includes, but is not limited to, a Physical Vapor Deposition (PVD) process, a Chemical Vapor Deposition (CVD) process, an Atomic Layer Deposition (ALD) process, etc.

In some embodiments, the first trench T1 includes, but is not limited to, a Shallow Trench Isolation (ST1) structure.

Figure 5:
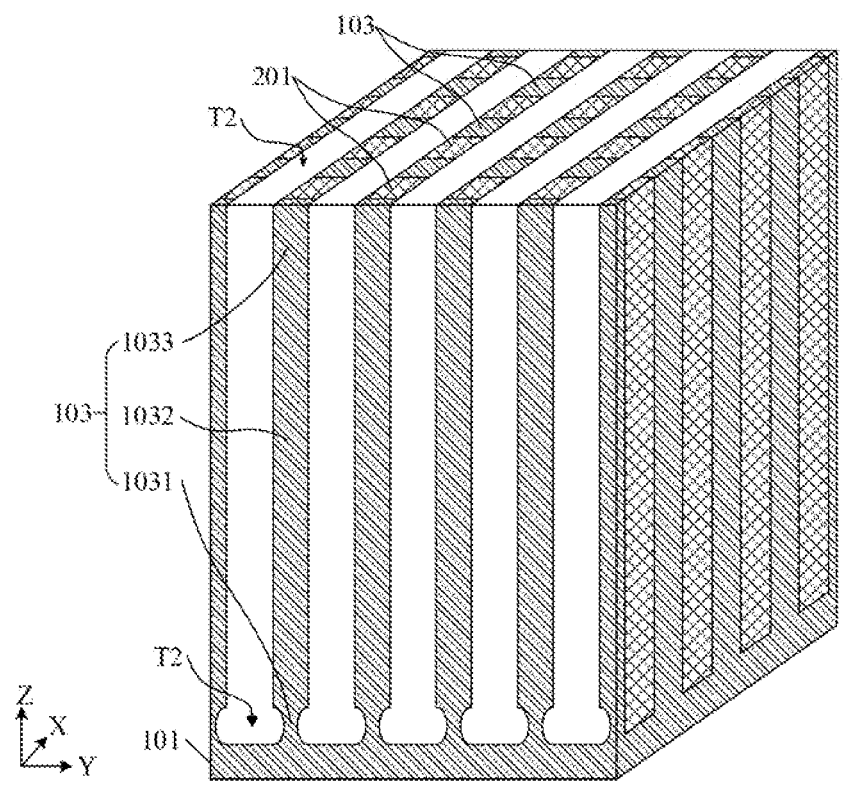

With reference to FIG. 5, second etching is performed on the top surface of the semiconductor base 100 through the LE process, so as to form, in the semiconductor base 100, a plurality of second trenches T2 spaced apart from each other and arrayed in the second direction. Herein, each second trench T2 extends in the first direction. Each semiconductor bar 102 is divided into a plurality of semiconductor pillars 103 by the second trenches T2.

Herein, the second trenches T2 are arranged in the semiconductor base. That is to say, a depth of the second trench T2 in the third direction is less than the thickness of the semiconductor base 100 in the third direction.

The second etching includes, but is not limited to, a dry plasma etching process.

In some embodiments, the second trench T2 includes, but is not limited to, an ST1 structure.

With reference to FIG. 5, a bottom portion of each of the plurality of second trenches T2 is expanded. Herein, the expanding process may be understood that the bottom portions of the second trenches T2 are etched in the second direction, so that a diameter width of the bottom portion of the second trench T2 in the second direction is greater than a diameter width of a top portion of the corresponding trench in the second direction.

Herein, the used etching process may include a wet etching process, a dry etching process, etc.

Exemplarily, in the wet etching process, an etchant is introduced into the bottom portion of the second trench T2.

By anisotropic etching of the etchant, the diameter width of the bottom portion of the second trench T2 in a Y-axis direction is increased.

Exemplarily, in the dry etching process, by controlling plasma to perform lateral etching, a trench structure with an increased diameter width is formed at the bottom portion of the second trench T2.

In the practical application, the bottom portion of each first trench T1 may also be expanded during formation of the first trench T1. Herein, the bottom portion of each second trench T2 being expanded is taken as an example.

In some embodiments, the expansion of the bottom portion of each first trench and/or the bottom portion of each second trench adopts, but is not limited to, a BOSCH etching process.

Exemplarily, with reference to FIG. 5, the trenches with a consistent width in the third direction are formed firstly through a normal etching process. For example, the second trenches are formed through a shallow trench isolation process (the morphology of this trench may be understood with reference to the morphology of the first trench in FIG. 3). Then, the bottom portions of the second trenches are expanded through the BOSCH etching process, so as to form third trenches with an expanded bottom portion as shown in FIG. 5.

In the practical application, the depth of the second trench T2 in the third direction may be the same as or different from the depth of the first trench T1 in the third direction. Exemplarily, the depth of the second trench T2 in the third direction is substantially the same as the depth of the first trench T1 in the third direction. In this way, the adjustment of process parameters in the manufacturing process may be reduced, thereby reducing the process difficulty.

In the embodiments of the disclosure, after the bottom portion of each first trench T1 and/or the bottom portion of each second trench T2 are/is expanded, the bottom areas of a plurality of cubic pillars arranged on the substrate 101 are etched through the etching process, so that the sizes of the bottom areas of the cubic pillars are reduced, so as to form the active pillars 103, as shown in FIG. 5.

It should be noted that, herein, each semiconductor pillar 103 remains as a single part, which includes a first portion 1031, a second portion 1032 arranged on the first portion, and a third portion 1033 arranged on the second portion. The first portion 1031, the second portion 1032 and the third portion 1033 in each semiconductor pillar 103 are only configured to regionally divide the semiconductor pillar 103 in the extending direction of the semiconductor pillar 103, but it does not mean that the first portion 1031, the second portion 1032 and the third portion 1033 may be separated from each other or have different structures with obvious stacked interfaces.

In some embodiments, a maximum diameter width of the first portion 1031 in the first direction is less than a minimum diameter width of the second portion 1032 in the first direction; and/or the maximum diameter width of the first portion 1031 in the second direction is less than the minimum diameter width of the second portion 1032 in the second direction.

Exemplarily, when the second trench T2 is expanded, the maximum diameter width of the first portion 1031 of the semiconductor pillar in the Y-axis direction is less than the minimum diameter width of the second portion 1032 of the semiconductor pillar in the Y-axis direction.

In the embodiments of the disclosure, the semiconductor pillar with a smaller bottom diameter width is formed, which facilitates oxidizing the plurality of semiconductor pillars to form the active pillars in the subsequent process, so as to provide a corresponding oxidation pillar between each active pillar and the substrate. In this way, the storage structure (for example, the capacitors) formed on a portion of the sidewall of the active pillar can be isolated, thereby reducing the leakage of the storage structure (for example, the capacitor) during using.

Figure 6:
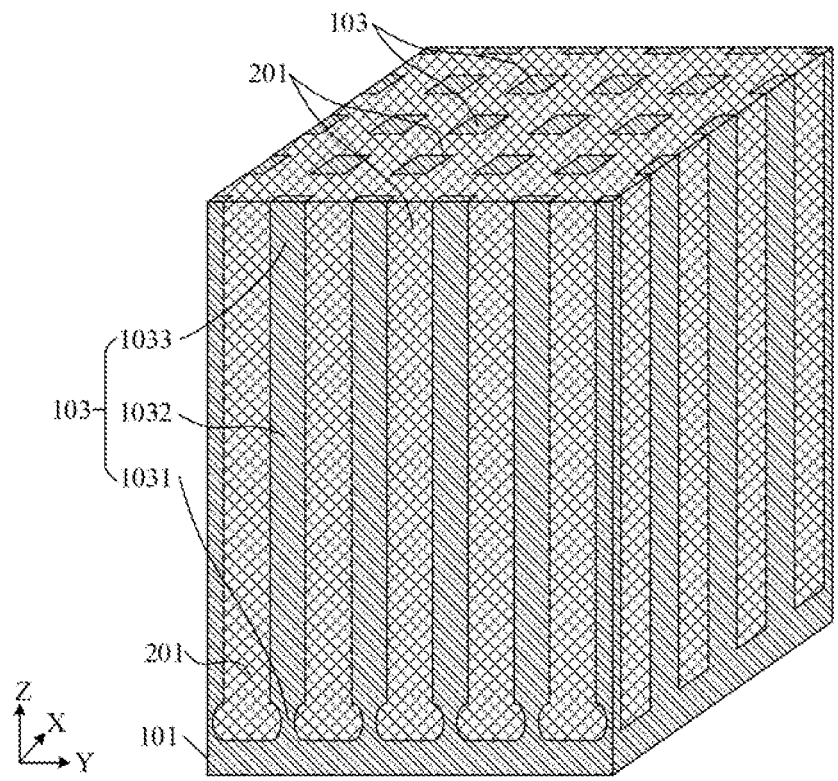

With reference to FIG. 6, the first insulation material 201 is formed in the second trenches. The top surface of the first insulation material 201 is substantially flush with the top surface of the semiconductor base 100.

In some embodiments, a constituent material of the first insulation material 201 includes, but is not limited to, silicon oxide ($SiO_2$).

The method for forming the first insulation material 201 includes, but is not limited to, a PVD process, a CVD process, etc.

In addition, after the first insulation material 201 is completely filled in the second trenches T2, Chemical Mechanical Polishing (CMP) is performed on the top surface of the first insulation material 201 and the top surface of the semiconductor pillar 103, so that the top surface of the first insulation material 201 is flush with the top surface of the semiconductor pillar 103.

With reference to FIG. 7 to FIG. 11, the operation b is performed, in which a support layer is formed.

In some embodiments, the operation that the support layer is formed includes the following operations.

A first insulation material is filled between the plurality of semiconductor pillars to form a first insulation layer.

A second insulation material covering a top surface of the first insulation layer and covering top surfaces of the plurality of semiconductor pillars is deposited to from a second insulation layer.

A portion of the second insulation layer is removed in the second direction to form a plurality of first shallow trenches, in which a bottom surface of each of the plurality of first shallow trenches is flush with the top surface of each of the plurality of semiconductor pillars. The first insulation material is filled in the plurality of first shallow trenches.

A portion of the second insulation layer is removed in the first direction to form a plurality of second shallow trenches, in which a bottom surface of each of the plurality of second shallow trenches is flush with the top surface of each of the plurality of semiconductor pillars, and the plurality of second shallow trenches expose the top surfaces of the plurality of semiconductor pillars. The second insulation material is filled in the plurality of second shallow trenches.

A remaining portion of the second insulation layer and the plurality of second shallow trenches filled with the second insulation material collectively form the support layer.

Figure 7:
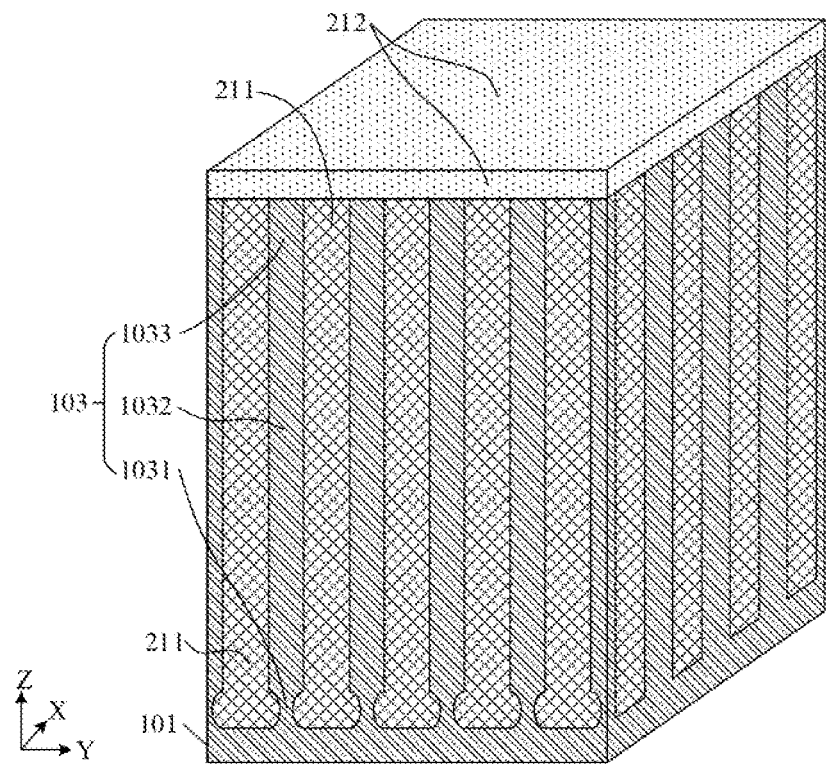

With reference to FIG. 7, the first insulation material 201 (with reference to FIG. 6) is completely filled between the plurality of semiconductor pillars 103, so as to form a first insulation layer 211.

With reference to FIG. 7, a second insulation material is deposited. The second insulation material covers the top surface of the first insulation layer 211 and the top surfaces of the semiconductor pillars 103, so as to form a second insulation layer 212.

Herein, the method for forming the second insulation layer 212 includes, but is not limited to, a PVD process, a CVD process, etc.

Herein, a material of the second insulation layer 212 may be different from a material of the first insulation layer 211. Exemplarily, the constituent material of the second insulation layer 212 includes, but is not limited to, silicon nitride or carbon. The constituent material of the first insulation layer 211 includes, but is not limited to, silicon oxide.

Figure 8:
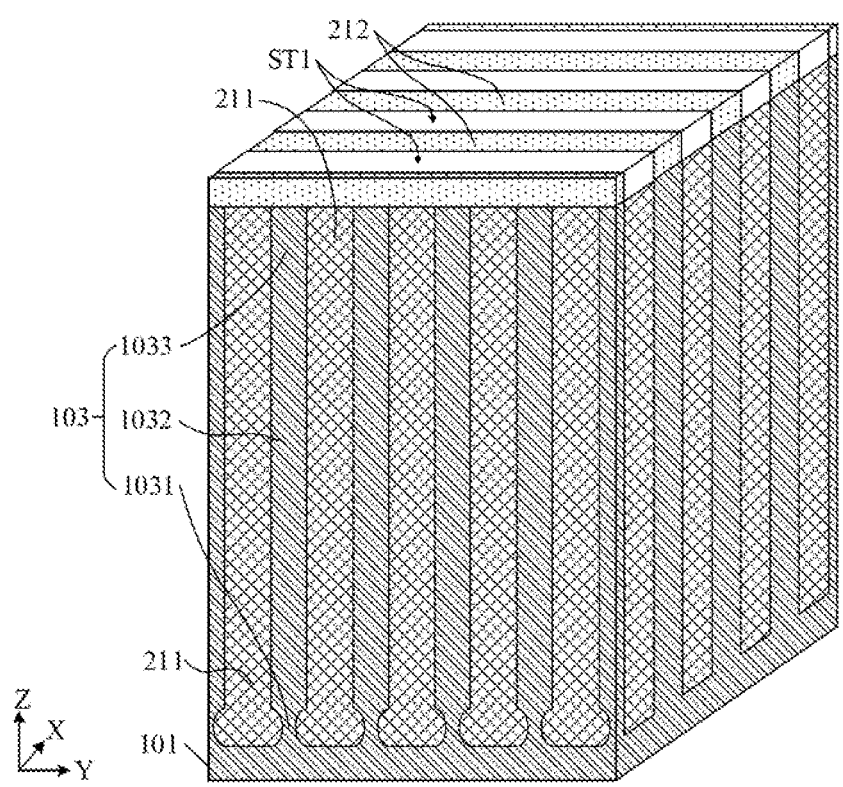

With reference to FIG. 8, a portion of the second insulation layer 212 is removed in the second direction through the LE process, so as to form a plurality of first shallow trenches ST1. A bottom surface of the first shallow trench ST1 is flush with the top surface of the semiconductor pillar 103.

Herein, the top surface of the semiconductor pillar 103 is not exposed by the first shallow trench ST1.

Figure 9:
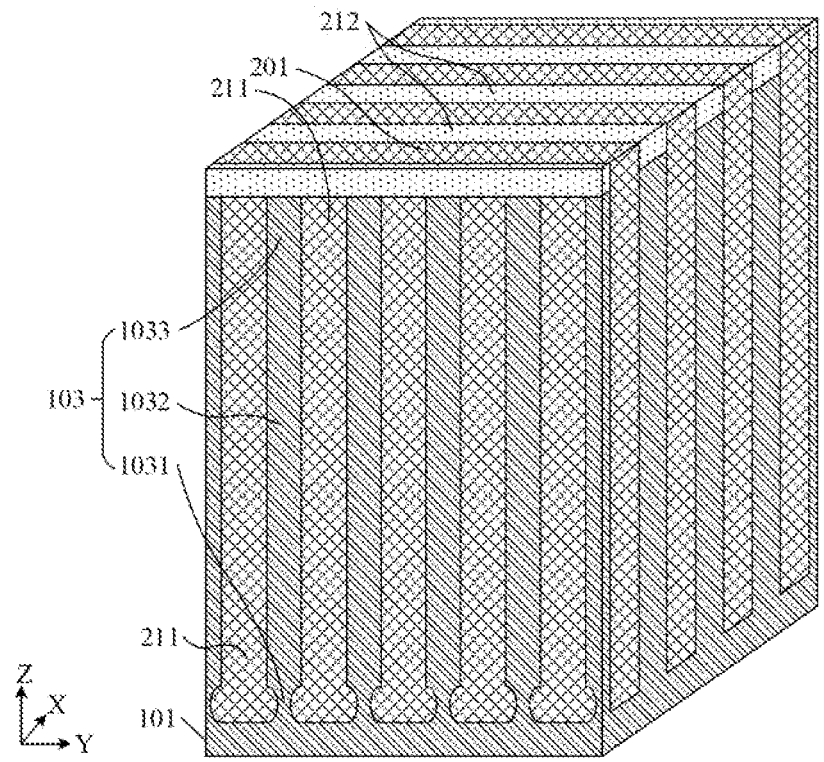

With reference to FIG. 9, the first insulation material 201 is filled in the first shallow trenches ST1 through processes including, but not limited to, a PVD process, a CVD process.

Herein, the first insulation material 201 is the same as the material of the first insulation layer 211. Exemplarily, the constituent material of the first insulation material 201 includes, but is not limited to, silicon oxide.

Figure 10:
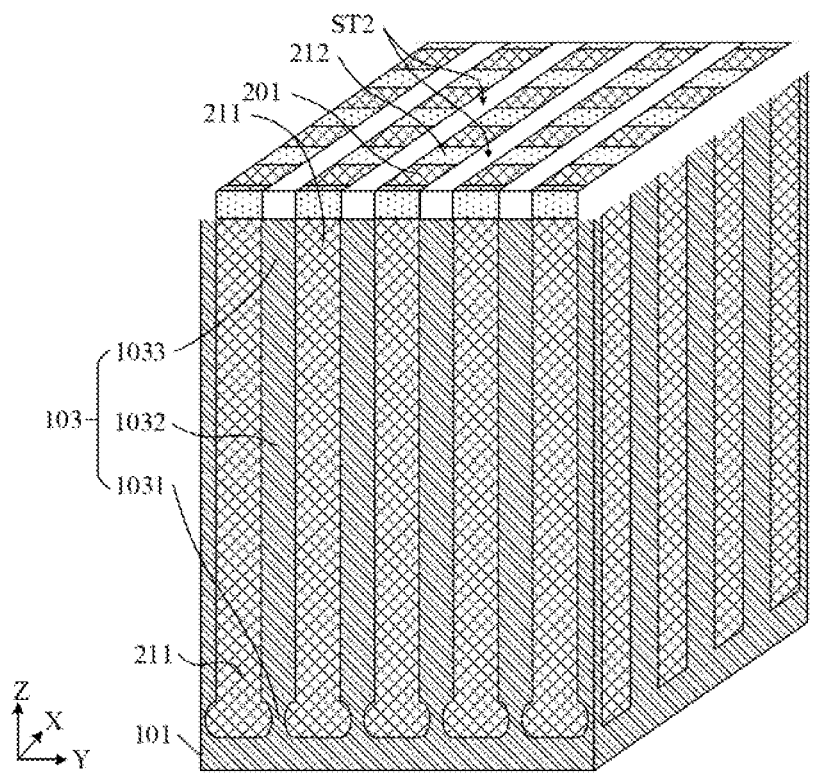

With reference to FIG. 10, a portion of the second insulation layer 212 and a portion of the first insulation material 201 are removed in the first direction through the LE process, so as to form a plurality of second shallow trenches ST2. A bottom surface of the second shallow trench ST2 is flush with the top surface of the semiconductor pillar 103.

Herein, the top surface of the semiconductor pillar 103 is exposed by the second shallow trench ST2.

Figure 11:
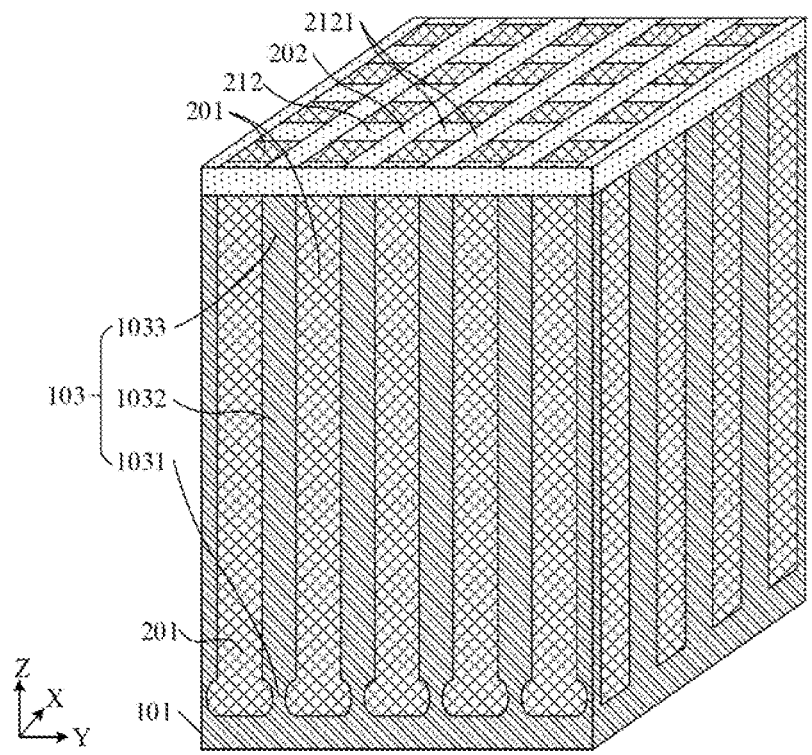

With reference to FIG. 11, the second insulation material 202 is filled in the plurality of second shallow trenches ST2 through processes including, but not limited to, a PVD process, a CVD process. A remaining portion of the second insulation layer 212 and the plurality of second shallow trenches filled with the second insulation material 202 collectively form the support layer 2121.

Herein, the second insulation material 202 is the same as the material of the second insulation layer 212, and is different from the first insulation material 201. The constituent material of the second insulation material 202 includes, but is not limited to, silicon nitride or carbon. The constituent material of the first insulation material 201 includes, but is not limited to, silicon oxide.

In this way, the support layer 2121 is configured to protect the top surfaces of the active pillars 103. Meanwhile, the support layer 2121 covering the top surfaces of the active pillars 103 is a net structure that is integrally formed, so as to effectively support the semiconductor pillars 103. That is to say, the support layer 2121 can not only protect the top surfaces of the active pillars 103, but also support the plurality of semiconductor pillars 103 arranged in an array, which is beneficial to form a stable semiconductor structure.

Figure 12:
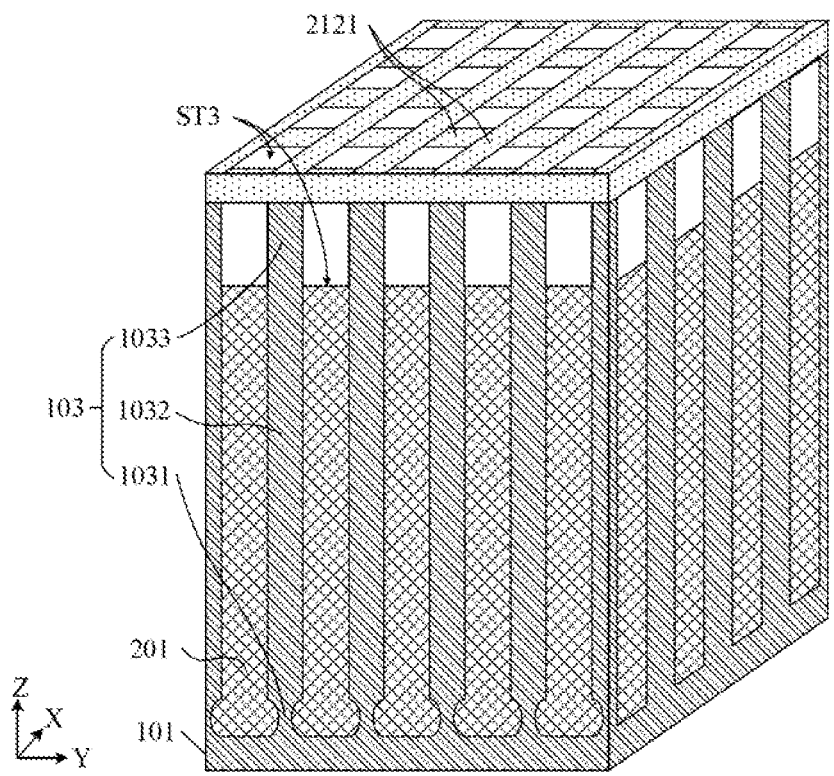
Figure 13:
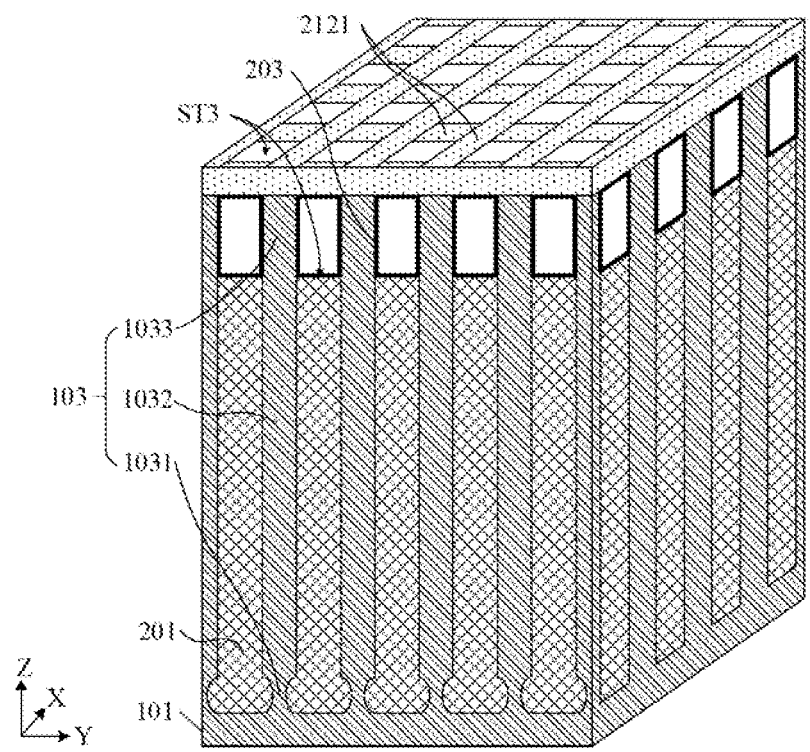
Figure 14:
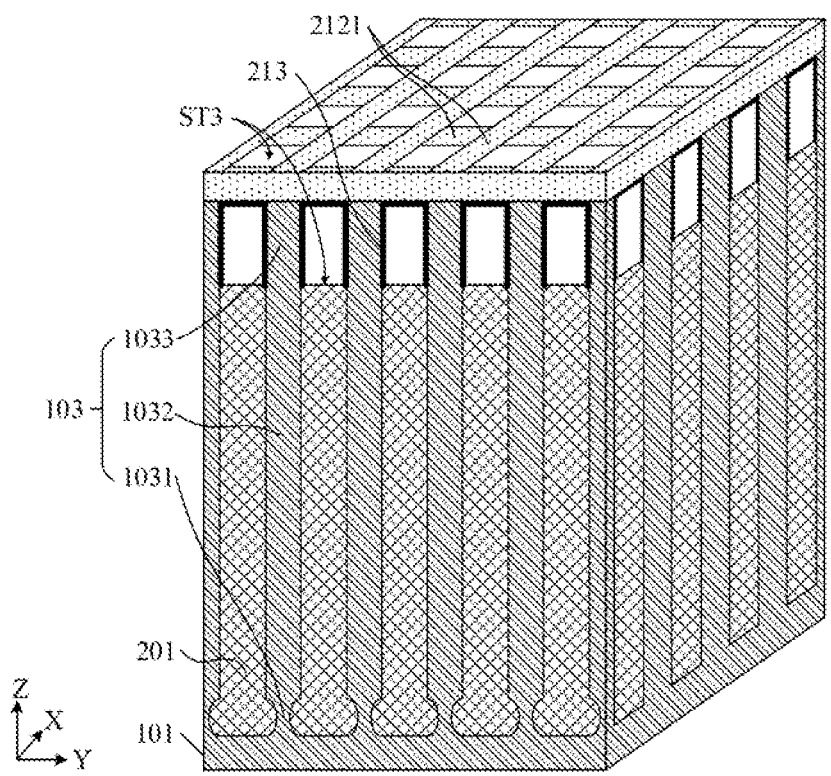

With reference to FIG. 12 to FIG. 14, the operation c is performed, in which the second protective layer is formed.

In some embodiments, the operation that the second protective layer is formed includes the following operations.

A portion of the first insulation material is removed to form a plurality of third shallow trenches, in which a bottom surface of each of the plurality of third shallow trenches is flush with a bottom surface of the third portion, and each of the plurality of third shallow trenches exposes the sidewall of the third portion.

A sacrificial material covering at least the sidewall of the third portion is deposited, so as to form the second protective layer.

With reference to FIG. 12, a portion of the first insulation material 201 is removed through the etching process, so as to form a plurality of third shallow trenches ST3. A bottom surface of each third shallow trench ST3 is flush with a bottom surface of the third portion 1033, and each third shallow trench exposes the sidewall of the third portion 1033.

Herein, the used etching process may include a dry etching process, etc.

Exemplarily, in the dry etching process, by using the support layer 2121 as a mask, the first insulation material 201 (with reference to FIG. 11) between grids of the support layer 2121, and the first insulation material 201 (with reference to FIG. 11) between the third portions 1033 are etched in a Z-axis direction, so as to form the third shallow trenches ST3.

With reference to FIG. 13, a sacrificial material 203 is deposited in the third shallow trenches ST3 through processes including, but not limited to, a PVD process, a CVD process, etc. The sacrificial material 203 covers sidewalls and bottom surfaces of the third shallow trenches ST3, and the exposed bottom surface of the support layer 2121.

Herein, a material of the sacrificial material 203 is different from the material of the first insulation material 201. Exemplarily, the constituent material of the sacrificial material 203 includes, but is not limited to, silicon nitride or carbon. The constituent material of the first insulation layer 211 includes, but is not limited to, silicon oxide.

With reference to FIG. 14, the sacrificial material 203 (with reference to FIG. 13) covering the bottom surfaces of the third shallow trenches ST3 is removed through the etching process, and the sacrificial material covering at least the sidewalls of the third portions 1033 is remained, so as to form the second protective layer 213.

Herein, the used etching process may include a wet etching process, a dry etching process, etc.

Exemplarily, in the dry etching process, by controlling plasma to perform longitudinal etching, the sacrificial material 203 covering the bottom surfaces of the third shallow trenches ST3 is removed, and at least the sacrificial material 203 covering the sidewalls of the third portions 1033 is remained.

In this way, the second protective layer covers the sidewalls of the third portions 1033, so that unnecessary contamination to the third portions 1033 in the subsequent manufacturing process can be reduced. It should be noted that, in the subsequent process, the third portion 1033 is configured to form a channel structure of the transistor. It can be understood that the effect of the channel structure on the performance of the semiconductor structure is critical. The second protective layer covers the sidewalls of the third portions 1033, and the support layer 2121 covers the top surfaces of the third portions 1033, so that the contamination to the third portions 1033 in the subsequent process can be avoided, thereby avoiding unnecessary defects in the channel structure of the transistor.

With reference to FIG. 15 to FIG. 18, the operations d and e are performed, in which the plurality of first sub active pillars are formed.

Figure 15:
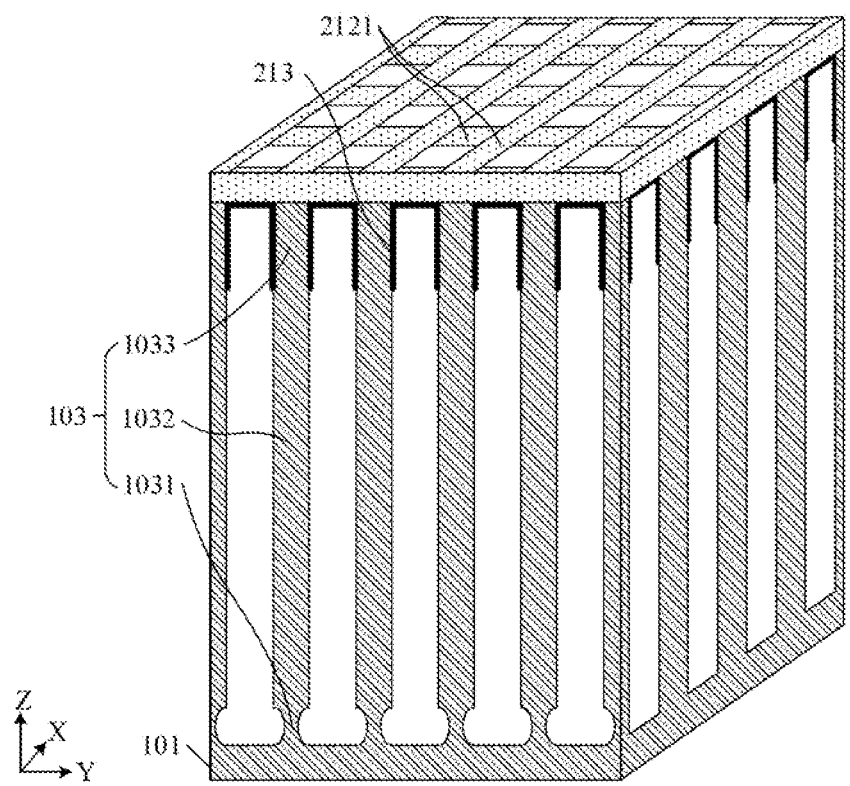

With reference to FIG. 15, a remaining portion of the first insulation material 201 (with reference to FIG. 14) between the active pillars 103 is removed through the etching process, so as to expose the sidewalls of the first portions 1031, the sidewalls of the second portions 1032, and a portion of the top surface of the substrate 101.

Herein, the used etching process may include a wet etching process, a dry etching process, etc.

Figure 16:
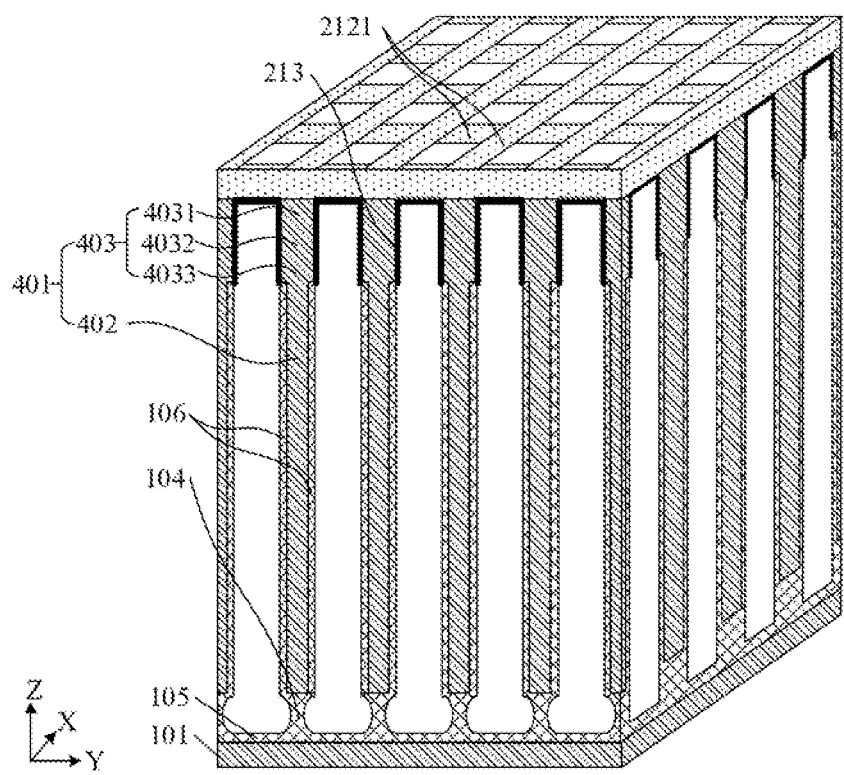

With reference to FIG. 16, the semiconductor pillar 103 (with reference to FIG. 15) is oxidized, so as to completely oxidize the first portion 1031 (with reference to FIG. 15) into an oxidation pillar 104, and to oxidize the surface of the second portion 1032 (with reference to FIG. 15) into an oxide layer 106.

Exemplarily, the semiconductor pillar 103 is oxidized through an oxidation process, so as to completely oxidize the first portion 1031 into the oxidation pillar 104, and to oxidize the exposed surface of the second portion 1032 of the semiconductor pillar into the oxide layer 106. Meanwhile, the top surface of the substrate 101 is also oxidized to form a substrate oxide layer 105.

Herein, materials of the oxidation pillar 104 and the oxide layer 106 are the same. Exemplarily, the constituent materials of the oxidation pillar 104 and the oxide layer 106 include, but are not limited to, silicon oxide.

Herein, it should be noted that, after the second trench T2 is expanded as described above, the size of a transition portion (i.e. the first portion 1031) between the bottom portion of the semiconductor pillar 103 and the substrate 101 is relatively small, so that the first portion is easy to be completely oxidized. Meanwhile, the size of the second portion 1032 is relatively large, so that only the surface of the second portion is oxidized.

After the semiconductor pillar 103 is oxidized, a portion of the third portion 1033 (with reference to FIG. 15) and a portion of the second portion 1032 which are not oxidized (i.e. a portion between the active pillar 401 and the substrate 101) are electrically isolated by the oxidation pillar 104. Therefore, leakage defects between the active pillar 401 and the substrate 101 can be prevented.

Here and hereinafter, each active pillar 401 remains as a single part, which includes a first sub active pillar 402, and a second sub active pillar 403 arranged on the first sub active pillar 402. The first sub active pillar 402 and the second sub active pillar 403 in each active pillar 401 are only configured to regionally divide the active pillar 401 in the extending direction of the active pillar 401, but it does not mean that the first sub active pillar 402 and the second sub active pillar 403 may be separated from each other or have different structures with obvious stacked interfaces.

It can be understood that, when the active pillar 401 is formed after the semiconductor pillar 103 is oxidized, the first sub active pillar 402 and the second sub active pillar 403 have been synchronously formed.

Here and hereinafter, each second sub active pillar 403 remains as a single part. The second sub active pillar 403 includes a bottom portion 4033 of the second sub active pillar, a middle portion 4032 of the second sub active pillar arranged on the bottom portion 4033 of the second sub active pillar, and a top portion 4031 of the second sub active pillar arranged on the middle portion 4032 of the second sub active pillar. The bottom portion 4033 of the second sub active pillar, the middle portion 4032 of the second sub active pillar and the top portion 4031 of the second sub active pillar in each second sub active pillar 403 are only configured to regionally divide the second sub active pillar 403 in the extending direction of the second sub active pillar 403, but it does not mean that the bottom portion 4033 of the second sub active pillar, the middle portion 4032 of the second sub active pillar and the top portion 4031 of the second sub active pillar may be separated from each other or have different structures with obvious stacked interfaces.

Figure 17:
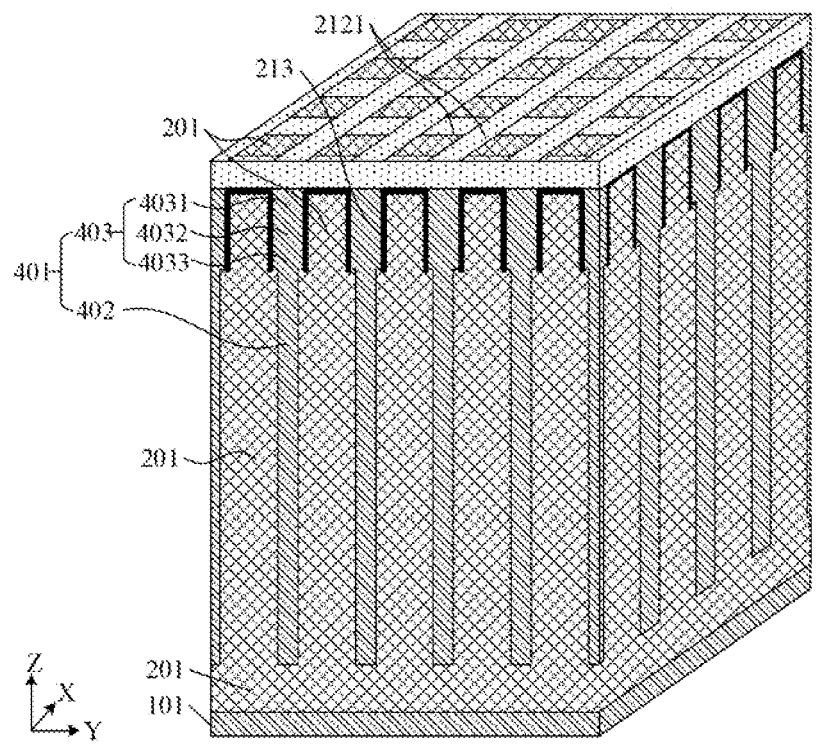

With reference to FIG. 17, the first insulation material 201 is Filled in gaps between the oxide layers and between the oxidation pillars, and the first insulation material 201 is filled in a gap of the second protective layer 213 and a grid-like gap of the support layer 2121.

Herein, the method for filling the first insulation material 201 includes, but is not limited to, a PVD process, a CVD process, etc.

The first insulation material 201 may be the same as or different from materials of the oxidation pillar 104 (with reference to FIG. 16) and the oxide layer 106 (with reference to FIG. 16). Exemplarily, the constituent material of the first insulation material 201 includes, but is not limited to, silicon oxide. Exemplarily, the constituent materials of the first insulation material 201, the oxidation pillar 104 and the oxide layer 106 may be the same, which are shown as the first insulation material 201 herein.

In the practical application, the first insulation material 201 may be filled between the plurality of oxidation pillars 104, between the plurality of active pillars 401, and in the grid-like gap of the support layer 2121, so that the top surface of the first insulation material 201 is flush with the top surface of the support layer 2121.

Figure 18:
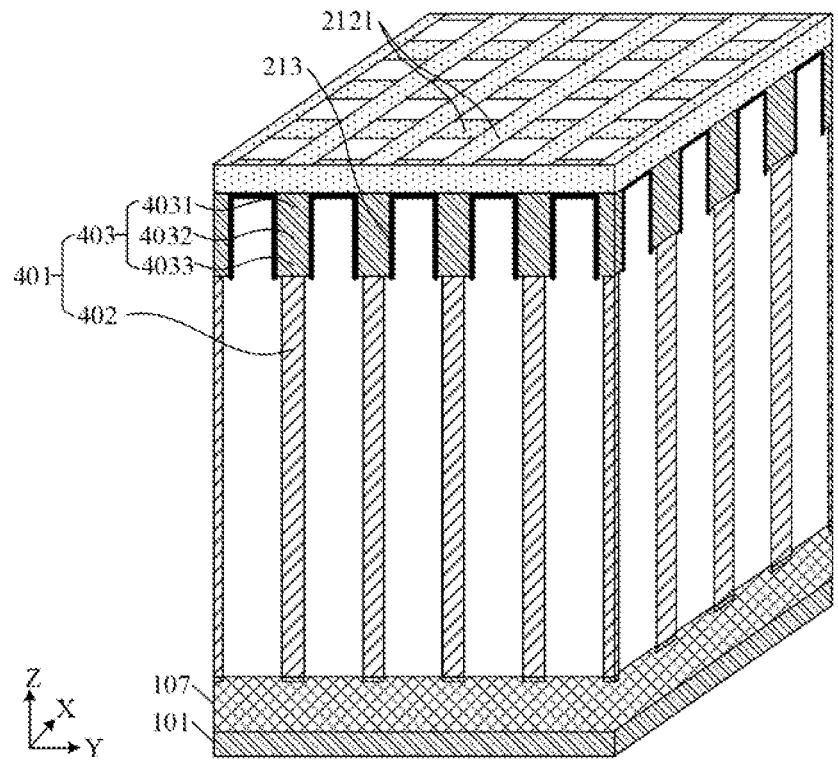

With reference to FIG. 18, through the etching process, the first insulation material 201 in the grid-like gap of the support layer 2121 and in the gap of the second protective layer 213 is removed, and the first insulation material 201 between the first sub active pillars 402 is removed, so as to expose the sidewalls of the first sub active pillars 402. Meanwhile, the first insulation material on the substrate 101 that is not removed is remained to form an isolation structure 107.

In some specific embodiments, the first sub active pillars 402 may extend into the isolation structure 107, and penetrate through the isolation structure 107 in the extending direction of the first sub active pillar 402. The bottom portion of the first sub active pillar 402 has a portion extending into the isolation structure 107. The isolation structure 107 may provide stable support for the first sub active pillars 402. Herein, the used etching process may include a wet etching process, a dry etching process, etc.

With reference to FIG. 16 and FIG. 18, the first insulation material 201 between the plurality of oxidation pillars 104, the oxidation pillars 104 and the substrate oxide layer 105 collectively form the isolation structure 107 arranged on the substrate 101.

Exemplarily, the constituent material of the isolation structure 107 includes, but is not limited to, silicon oxide. With the isolation structure 107, the leakage between the functional devices (for example, the first sub active pillar 402, the storage structure 315 as shown in FIG. 21) on the isolation structure 107 and the substrate 101 can be improved.

Figure 20:
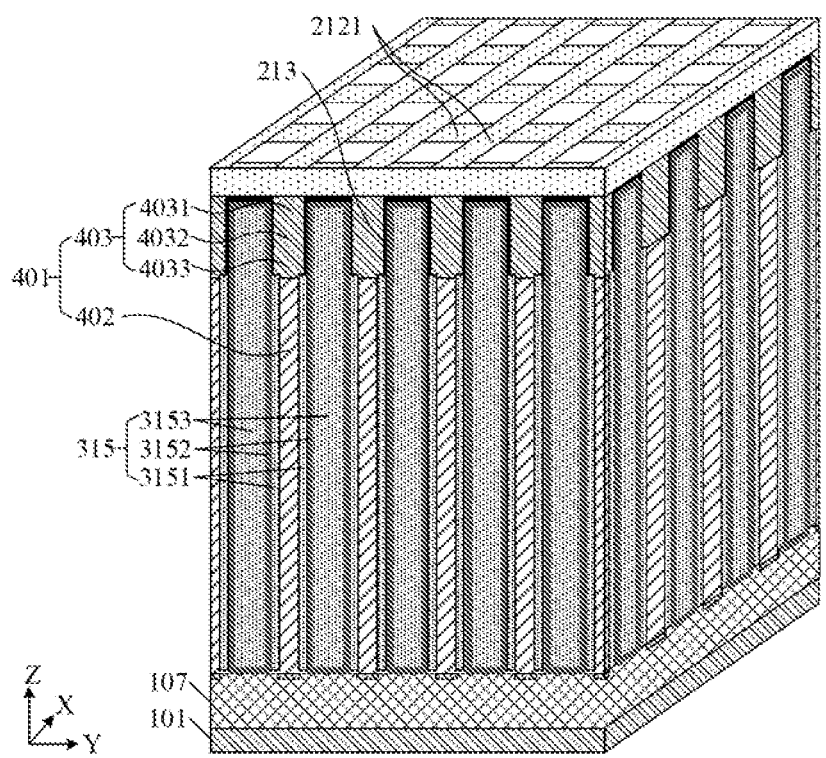
Figure 21:
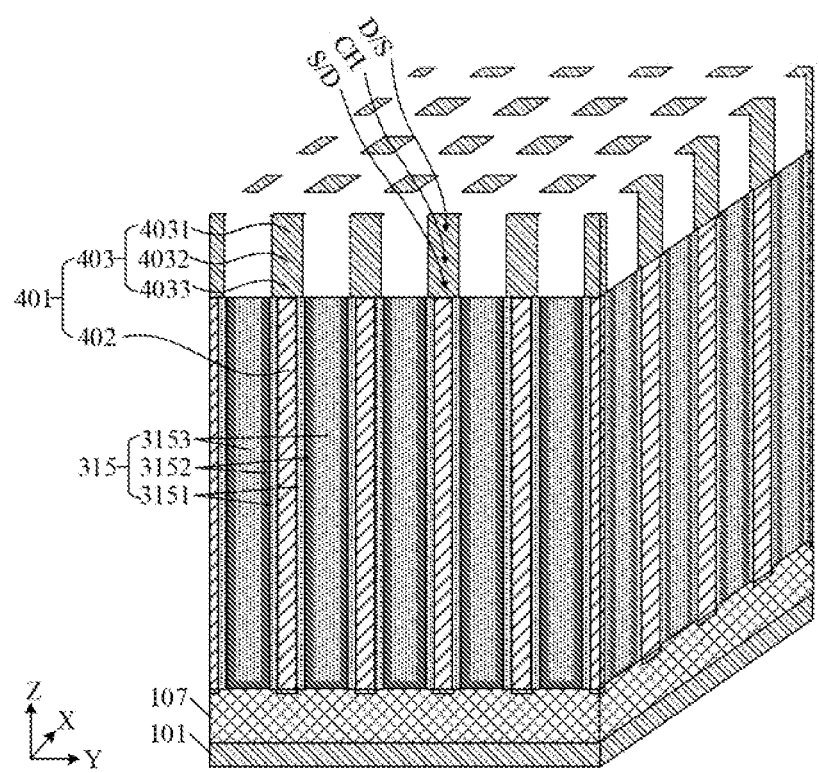

With reference to FIG. 20 and FIG. 21, the operation f is performed, in which the second sub active pillar is formed.

With reference to FIG. 20 and FIG. 21, after the storage structure 315 is formed, the support layer 2121 and the second protective layer 213 are removed to form the second sub active pillar 403.

In the practical application, with reference to FIG. 20, the dielectric layer filled in the gap between the second sub active pillars 403 needs to be removed, and only the second sub active pillars 403 are remained.

Exemplarily, in the process of filling the support layer 2121 in the gap between the second sub active pillars 403 and forming the storage structure 315, a portion of the first electrode layer 3151, a portion of the dielectric layer 3152 and a portion of the second electrode layer 3153 that are filled in the support layer 2121 needs to be removed.

Herein, the support layer 2121 is removed through the etching process. A portion of the first electrode layer 3151, a portion of the dielectric layer 3152 and a portion of the second electrode layer 3153 that are filled in the support layer 2121 are removed, and the storage structure 315 covering at least the sidewalls of the first sub active pillars 402 is remained. The second protective layer 213 covering the sidewalls of the second sub active pillars 403 is removed.

Herein, the used etching process may include a wet etching process, a dry etching process, etc.

Exemplarily, in the dry etching process, by controlling plasma to perform longitudinal etching, the dielectric layer that is filled in the gap between the second sub active pillars 403 is removed, so as to form the second sub active pillars 403, and to expose the sidewalls and the top surfaces of the second sub active pillars 403.

It can be understood that, the first sub active pillar 402 and the second sub active pillar 403 have been synchronously formed when the active pillar 401 (with reference to FIG. 16) is formed. Herein, only the dielectric layer that is filled in the gap between the second sub active pillars 403 needs to be removed (with reference to FIG. 20 and FIG. 21) to expose the sidewalls and the top surfaces of the second sub active pillars 403, so that a channel structure CH, a source S and a drain D of the transistor 400 are formed in the second sub active pillar 403, and a gate 405 and a gate oxide layer 404 (with reference to FIG. 31) are formed around the second sub active pillar 403 in the subsequent process.

In the embodiments of the disclosure, a plurality of active pillars are formed on the substrate, and each active pillar includes a first sub active pillar and a second sub active pillar arranged on the first sub active pillar. In the subsequent process, a memory cell is formed on the sidewall of the first sub active pillar, the channel structure, the source and the drain of the transistor are formed in the second sub active pillar, and the gate and the gate oxide layer are formed around the second sub active pillar. That is to say, the storage structure and the transistor are formed on the same active pillar, so that the difficulty of aligning the memory cell with the transistor can be reduced, thereby reducing the process difficulty.

With reference to FIG. 18, S202 is performed, in which a first element is added into the first sub active pillar.

In some embodiments, the first element includes an N-type doped element or a P-type doped element. The operation that the first element is added into the first sub active pillar includes the following operation. The N-type doped element or the P-type doped element is added into the first sub active pillar through a diffusion process or an ion implantation process.

Alternatively, the first element includes a metal element. The operation that the first element is added into the first sub active pillar includes the following operations. A metal layer containing the metal element and covering the sidewall of the first sub active pillar is formed. The metal layer reacts with the first sub active pillar through a rapid thermal annealing process, so as to form a metal compound.

With reference to FIG. 18, in some embodiments, the first element may include the N-type doped element or the P-type doping element. The first doped element is doped in the first sub active pillar 402 from the sidewall of the first sub active pillar 402 through a vapor phase diffusion process.

Herein, the N-type doped element may include at least one of nitrogen (N) element, phosphorus (P) element, arsenic (As) element, antimony (Sb) element, etc. The P-type doped element may include at least one of boron (B) element, gallium (Ga) element, indium (In) element, etc.

Exemplarily, the first element includes the phosphorus element. A gas containing the phosphorus element is introduced through the vapor phase diffusion process at a temperature ranging from 800° C. to 1200° C. The gas comes into contact with the sidewall of the first sub active pillar 402, so that a thin layer of medium containing the phosphorus element is firstly formed on the surface of the sidewall of the first sub active pillar 402. At the temperature ranging from 800° C. to 1200° C., the phosphorus element in the thin layer of medium is diffused inside the first sub active pillar 402, so that the phosphorus element is added into the first sub active pillar 402. Compared with the first sub active pillar 402 without the phosphorus element, the first sub active pillar 402 added with the phosphorus element has a lower resistivity.

In the practical application, it can also be determined whether the first element includes the N-type doped element or the P-type doped element according to the transistors (referring to the transistor 400 shown in FIG. 31) of different conductive types. Exemplarily, for example, if the transistor structure is an N-type transistor, the first element is the N-type doped element, and the N-type doped element is, for example, P, As, Sb. If the transistor structure is a P-type transistor, the first element is the P-type doped element, and the P-type doped element is, for example, B, Ga, In.

With reference to FIG. 18, in some other embodiments, the first element may include a metal element. A metal layer containing the metal element and covering the sidewall of the first sub active pillar 402 is formed through a thin film deposition process. The metal layer reacts with the first sub active pillar 402 through an annealing process, such as a rapid thermal annealing process, so as to form a metal compound.

Herein, the constituent material of the metal element includes at least one of cobalt (Co), nickel (Ni), tungsten (W), titanium (Ti), tantalum (Ta), copper (Cu), aluminum (Al), silver (Ag), or gold (Au).

Exemplarily, the first element includes cobalt element. The metal layer containing the cobalt element and covering the sidewall of the first sub active pillar 402 is formed through the thin film deposition process. The metal layer containing the cobalt element reacts with the first sub active pillar 402 through the rapid thermal annealing process, so as to form a cobalt compound. The cobalt element is added into the first sub active pillar 402 to form the cobalt compound, so that compared with the first sub active pillar 402 without the cobalt element, the first sub active pillar 402 added with the cobalt element has a lower resistivity.

In the practical application, according to actual requirements, the degree of reaction of the metal layer with the first sub active pillar may be regulated by adjusting the parameters of the thin film deposition process and/or the rapid thermal annealing process, so that the morphology of the formed metal compound can be controlled. For example, the metal layer may only react with the surface of the first sub active pillar, so that the surface layer of the first sub active pillar is formed as the metal compound. The metal layer may also react completely with the first sub active pillar, so that the entire first sub active pillar is formed as the metal compound.

In the embodiments of the disclosure, the resistivity of the first sub active pillar is reduced by adding the first element into the first sub active pillar, so that the resistance between the first sub active pillar and the storage structure can be reduced, thereby reducing the delay of signal transmission, and eventually improving the performance of the semiconductor structure.

Figure 19:
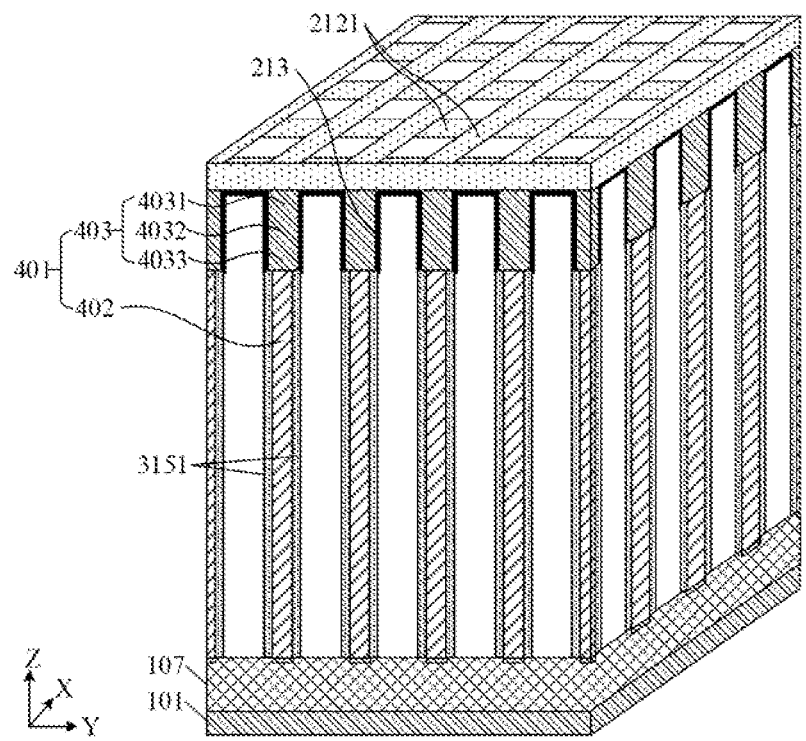

With reference to FIG. 19 and FIG. 20, S203 is performed, in which a storage structure is formed.

In some embodiments, the operation that the storage structure is formed at least on the sidewall of the first sub active pillar includes the following operations.

A first conductive layer covering the sidewall of the first sub active pillar is formed.

A dielectric layer covering at least a sidewall of the first conductive layer is formed.

A second conductive layer is formed in a gap of the dielectric layer.

With reference to FIG. 19, a first conductive layer 3151 covering the sidewall of the first sub active pillar 402 is formed.

Herein, the first conductive layer is configured as a lower electrode of a capacitor, the dielectric layer is configured as a dielectric medium of the capacitor, and the second conductive layer is configured as an upper electrode of the capacitor.

In some specific embodiments, the constituent material of the first conductive layer 3151 may include, but is not limited to, ruthenium (Ru), ruthenium oxide (RuO), and titanium nitride (TiN).

In the embodiments of the disclosure, the first conductive layer may be formed on the sidewall of the first sub active pillar through a selective deposition process or other deposition processes.

The selective deposition process means that the first conductive layer is selectively deposited on the sidewall of the first sub active pillar. Herein, the other deposition processes include, but are not limited to, a PVD process, a CVD process, an ALD process, etc.

In some specific embodiments, the operation that the first conductive layer 3151 covering the sidewall of the first sub active pillar 402 is formed includes the following operation.

The first conductive layer 3151 covering the sidewall of the first sub active pillar 402 is formed through the selective deposition process.

With reference to FIG. 20, a dielectric layer 3152 covering at least a sidewall of the first conductive layer 3151 is formed. A second conductive layer 3153 is formed in a gap of the dielectric layer 3152.

A constituent material of the dielectric layer includes a high dielectric constant (High-K) material. The High-K material generally refers to a material with a dielectric constant higher than 3.9, which is generally significantly higher than this value. In some specific examples, a material of the dielectric layer may include, but is not limited to, aluminum oxide ($Al_2O_3$), zirconium oxide (ZrO), hafnium oxide ($HfO_2$), strontium titanate ($SrTiO_3$), etc.

In some specific embodiments, the constituent material of the second conductive layer may include, but is not limited to, ruthenium, ruthenium oxide, and titanium nitride.

Herein, a method for forming the second conductive layer includes, but is not limited to, a PVD process, a CVD process, etc.

It should be noted that, the method for forming the first conductive layer and the second conductive layer in the above embodiments may also be understood that Conductive on Conductive (CoC) is formed through a selective deposition process. Herein, the selective deposition process includes, but is not limited to, an ALD process, etc.

In the embodiments of the disclosure, in the process of forming the first conductive layer through the selective deposition process, the material configured to form the first conductive layer is formed only on the sidewall of the first sub active pillar or formed on other selected materials, but is not formed on the top surface of the isolation structure. In this way, on the one hand, mutual isolation between the first electrode layers is guaranteed, so that mutual interference between the first electrode layers can be prevented; on the other hand, voids can be prevented from occurring during the formation of the first conductive layer by using other processes, thereby improving the reliability of the semiconductor structure.

With reference to FIG. 22 to FIG. 31, S204 is performed, in which a plurality of transistors are formed.

In some embodiments, after the storage structure is formed, the method further includes the following operation. A first protective layer arranged around a sidewall of a top portion of the second sub active pillar is formed.

The operation that the first protective layer is formed includes the following operations.

A first insulation material is formed between a plurality of second sub active pillars.

A portion of the first insulation material on the top portions of the plurality of second sub active pillars is removed to form a plurality of first grooves, in which each of the plurality of first grooves exposes two opposite sidewalls of the top portions of two second sub active pillars adjacent to each other in the first direction.

The plurality of first grooves are filled to form a plurality of first protective pillars.

A remaining portion of the first insulation material on the top portions of the plurality of second sub active pillars is removed, so as to form a plurality of second grooves extending in the first direction.

A plurality of second protective pillars are formed on sidewalls of the plurality of second grooves, in which the plurality of first protective pillars and the plurality of second protective pillars collectively form the first protective layer.

Figure 22:
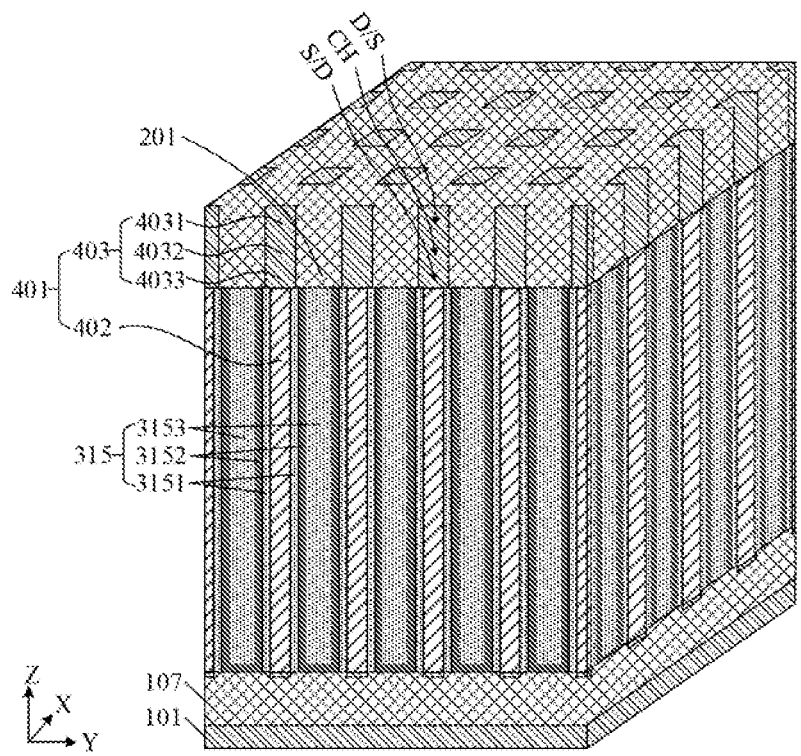

With reference to FIG. 22, the first insulation material 201 is formed between the second sub active pillars 403, in which the top surface of the first insulation material 201 is flush with the top surface of the second sub active pillar 403.

In addition, the top surface of the first insulation material 201 and the top surface of the second sub active pillar 403 are polished, so that the top surface of the first insulation material 201 is flush with the top surface of the semiconductor pillar 103.

Herein, the constituent material of the first insulation material 201 includes, but is not limited to, silicon oxide.

The method for forming the first insulation material 201 includes, but is not limited to, a PVD process, a CVD process, an ALD process, etc.

Figure 23:
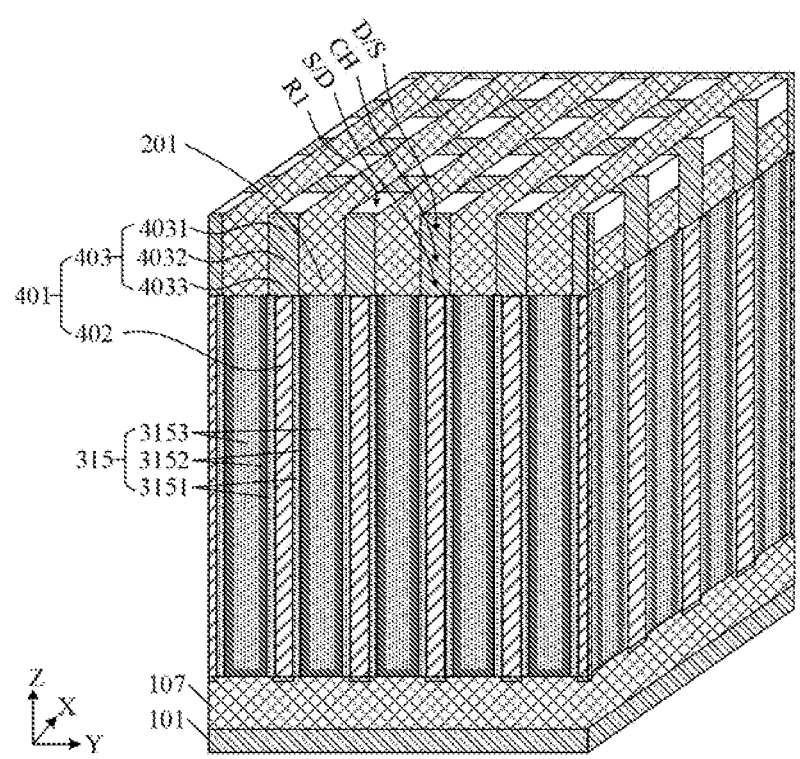

With reference to FIG. 23, a portion of the first insulation material on the top portions 4031 of the second sub active pillars is removed through the LE process to form a plurality of first grooves R1 arranged in an array in the first direction and in the second direction. Each first groove R1 exposes two opposite sidewalls of the top portions 4031 of two second sub active pillars adjacent to each other in the first direction. A bottom surface of each first groove R1 is substantially flush with the bottom surface of the top portion 4031 of the second sub active pillar. That is to say, a depth of the first groove R1 in the third direction is substantially the same as a thickness of the top portion 4031 of the second sub active pillar in the third direction.

The first etching includes, but is not limited to, a dry plasma etching process.

Figure 24:
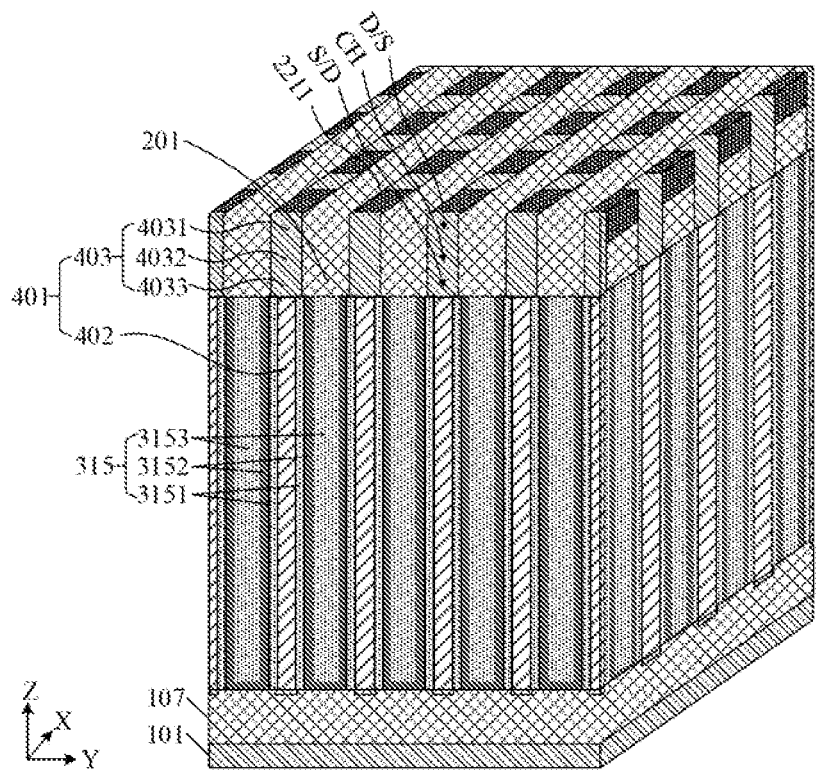

With reference to FIG. 24, a second insulation material is filled in the first grooves R1, so as to form a plurality of first protective pillars 2211, in which a top surface of the first protective pillar 2211 is substantially flush with the top surface of the top portion 4031 of the second sub active pillar. Herein, the first protective pillar 2211 is configured to protect the sidewall of the top portion 4031 of the second sub active pillar.

Herein, the method for forming the first protective pillar 2211 includes, but is not limited to, a PVD process, a CVD process, etc.

Herein, the constituent material of the first protective pillar 2211 may be different from the constituent material of the first insulation material 201. Exemplarily, the constituent material of the first protective pillar 2211 includes, but is not limited to, silicon nitride or carbon. The constituent material of the first insulation material 201 includes, but is not limited to, silicon oxide.

In some embodiments, the method for forming the first protective pillar 2211 includes, but is not limited to, a shallow trench isolation process.

Figure 25:
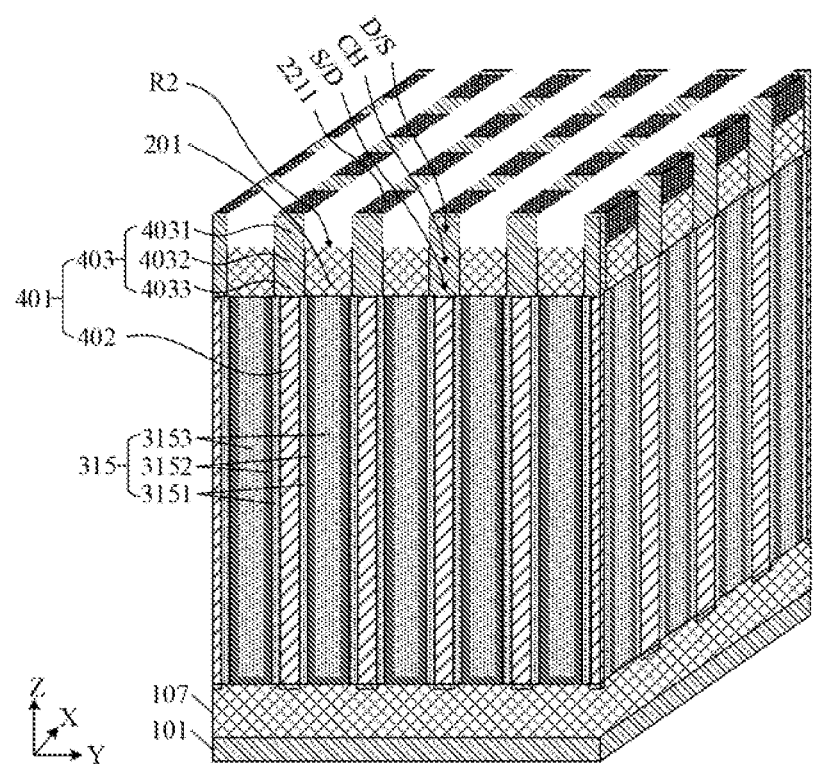

With reference to FIG. 25, a remaining portion of the first insulation material 201 on the top portions 4031 of the second sub active pillars is removed through the etching process, so as to form a plurality of second grooves R2 extending in the first direction. Each second groove R2 exposes at least other sidewalls (which may be understood as the two opposite sidewalls of the top portions 4031 of two second sub active pillars adjacent to each other in the second direction) of the top portions 4031 of the second sub active pillars which are not covered by the first protective pillars 2211. A bottom surface of each second groove R2 is substantially flush with the bottom surface of the top portion 4031 of the second sub active pillar. That is to say, a depth of the second groove R2 in the third direction is substantially the same as a thickness of the top portion 4031 of the second sub active pillar in the third direction.

The first etching includes, but is not limited to, a dry plasma etching process.

Figure 26:
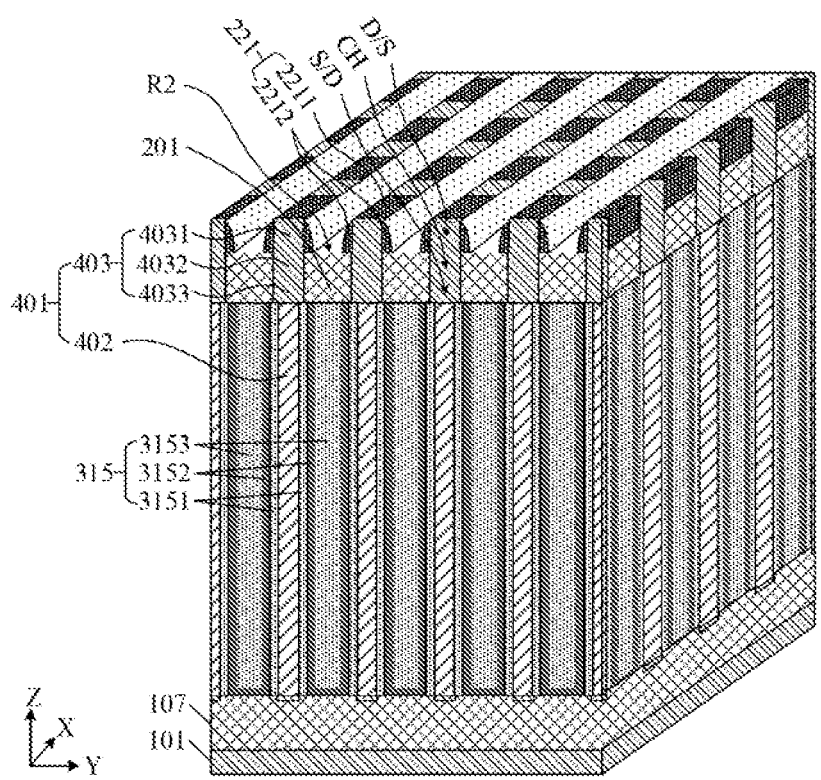

With reference to FIG. 26, a plurality of second protective pillars 2212 are formed through a spacer process.

The second insulation material is deposited on the sidewalls and the bottom surfaces of the second grooves R2 through processes including, but not limited to, a PVD process, a CVD process, etc. Meanwhile, the second insulation material is deposited on the top surfaces of the first protective pillars 2211 and on the top surfaces of the top portions 4031 of the second sub active pillars.

Through the etching process, the second insulation material on the bottom surfaces of the second grooves R2 is removed, the second insulation material on the top surfaces of the first protective pillars 2211 and on the top surfaces of the top portions 4031 of the second sub active pillars is simultaneously removed, and the second insulation material on the sidewalls of the second grooves is remained, so as to form the plurality of second protective pillars 2212. Each second protective pillar 2212 extends in the first direction, and is configured to protect the sidewall of the top portion 4031 of the second sub active pillar. Herein, the first protective pillars 2211 and the second protective pillars 2212 collectively form the first protective layer 221. The first protective layer 221 is arranged around the top portions 4031 of the second sub active pillars, so as to protect all of the sidewalls of the top portions 4031 of the second sub active pillars.

Herein, the constituent material of the second protective pillar 2212 may be different from the constituent material of the first insulation material 201. Exemplarily, the constituent material of the second protective pillar 2212 includes, but is not limited to, silicon nitride or carbon. The constituent material of the first insulation material 201 includes, but is not limited to, silicon oxide.

In some embodiments, the second protective pillars 2212 are formed through the dry etching process.

Exemplarily, in the dry etching process, by controlling plasma to perform longitudinal etching, the second insulation material on the bottom surfaces of the second grooves R2 is removed, the second insulation material on the top surfaces of the first protective pillars 2211 and on the top surfaces of the top portions 4031 of the second sub active pillars is simultaneously removed, and the second insulation material on the sidewalls of the second grooves is remained, so as to form the second protective pillars 2212.

Figure 30:
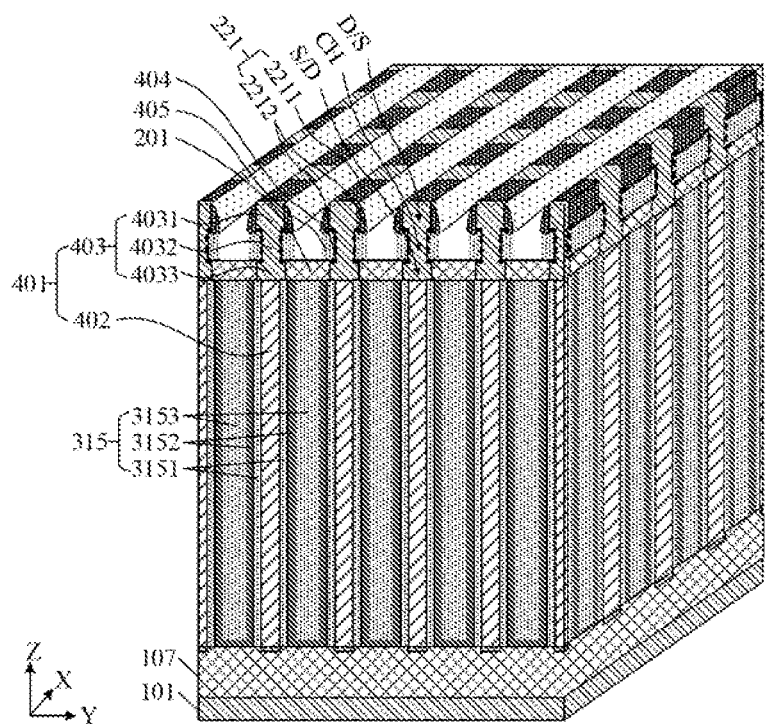

SI In the embodiments of the disclosure, the second protective pillars 2212 formed through the spacer process protect the sidewalls of the top portions 4031 of the second sub active pillars, and may also be configured as a mask to form the gate 405 (with reference to FIG. 30). As a mask, the second protective pillar 2212 formed through the spacer process may have a further miniaturized size on the basis of the existing photolithography process, so as to form the semiconductor structure with a smaller size. By using the first protective layer as a mask, the operation of the photolithography process can be reduced, thereby reducing the process cost and difficulty. Since the second protective pillar formed through the spacer process is formed through self-alignment based on the second sub active pillar, the accuracy and process window of the alignment of the gate (with reference to FIG. 30) formed in the subsequent process can be improved.

In some embodiments, the operation that the plurality of transistors are formed includes the following operations.

After the first protective layer is formed, the first insulation material corresponding to middle portions of the plurality of second sub active pillars is removed, so as to expose sidewalls of the middle portions of the plurality of second sub active pillars.

A gate oxide layer covering the sidewall of the middle portion of each of the plurality of second sub active pillars is formed.

A gate covering the gate oxide layer is formed.

A source is formed at a bottom portion of each of the plurality of second sub active pillars, and a drain is formed at the top portion of each of the plurality of second sub active pillars.

A plurality of isolation structures are formed between the plurality of second protective pillars and between a plurality of gates.

Figure 27:
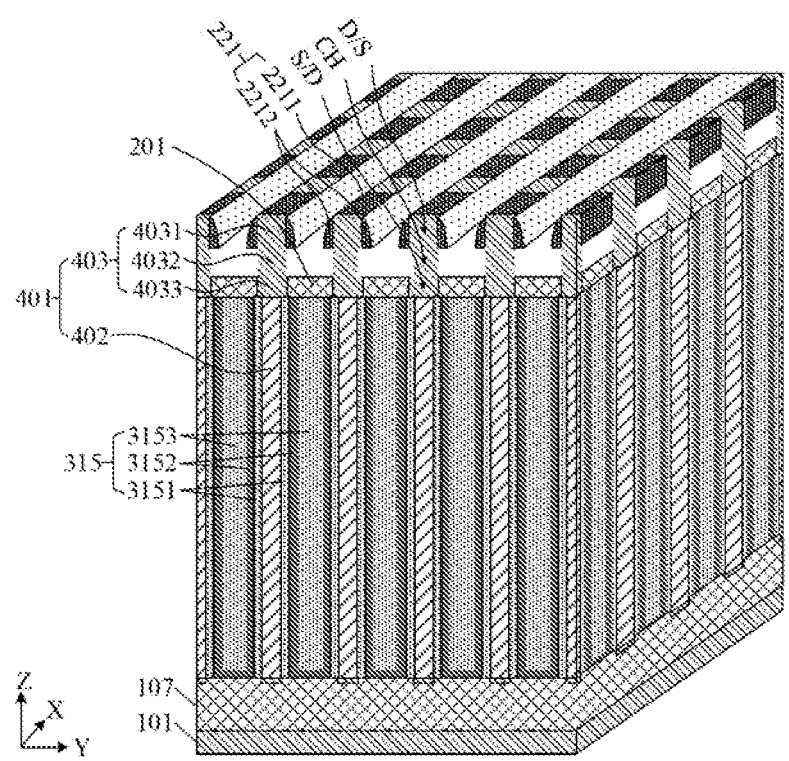

With reference to FIG. 27, after the first protective layer 221 is formed, when the first protective layer 221 protects all of the sidewalls of the top portions 4031 of the second sub active pillars, the first insulation material 201 corresponding to the middle portions 4032 of the second sub active pillars is removed to expose the sidewalls of the middle portions 4032 of the second sub active pillars. Herein, the top surface of the first insulation material 201 that is not removed is substantially flush with a bottom surface of the middle portion 4032 of the second sub active pillar. That is to say, a depth of the first insulation material 201 that is not removed in the third direction is substantially the same as a thickness of the bottom portion 4033 of the second sub active pillar in the third direction.

Herein, the used etching process may include a wet etching process, a dry etching process, etc.

Exemplarily, the first insulation material on the middle portions 4032 of the second sub active pillars is isotropically removed through a wet etching process, so as to expose the sidewalls of the middle portions 4032 of the second sub active pillars. In addition, the first insulation material 201 that is not removed covers the sidewalls of the bottom portions 4033 of the second sub active pillars.

Figure 29:
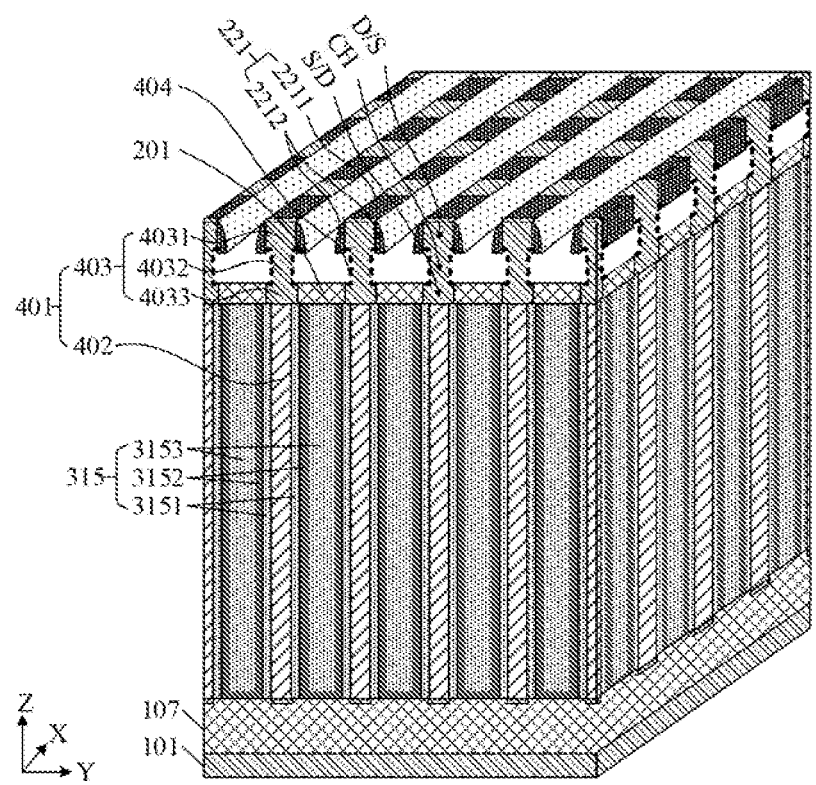

With reference to FIG. 29, a gate oxide layer 404 covering the sidewall of the middle portion 4032 of the second sub active pillar is formed.

By in situ oxidation of the sidewall of the middle portion 4032 of the second sub active pillar, the gate oxide layer 404 may be formed around the sidewall of the middle portion 4032 of each second sub active pillar.

The gate oxide layer 404 may also be deposited around the sidewall of the middle portion 4032 of each second sub active pillar through an ALD process.

Herein, a material of the gate oxide layer 404 includes, but is not limited to, silicon oxide.

With reference to FIG. 30, a gate 405 covering the gate oxide layer is formed.

In some embodiments, the operation that the gate 405 covering the gate oxide layer 404 is formed includes the following operations.

A gate conductive material is filled in a gap of the gate oxide layer 404.

A portion of the gate conductive material is removed by using the first protective layer as a mask layer, in which a remaining portion of the gate conductive material forms the gate 405.

The gate conductive material is filled in the gap of the gate oxide layer 404 through an Electro-Chemical Plating (ECP) process, a PVD process, a CVD process, etc. In the practical application, the gate conductive material may also be filled in the gap of the first protective layer 221. A top surface of the gate conductive material is flush with the top surface of the top portion 4031 of the second sub active pillar.

Herein, a constituent material of the gate conductive material includes at least one of cobalt, nickel, tungsten, tungsten nitride, titanium, titanium nitride, tantalum, tantalum nitride, copper, aluminum, aluminum copper, silver, or gold.

A portion of the gate conductive material is removed by using the first protective layer 221 as a mask layer through a wet etching process, a dry etching process, etc. A remaining portion of the gate conductive material forms the plurality of gates 405 arrayed in the second direction. Each gate 405 extends in the first direction. The gates of each transistor in each row of transistors arrayed in the second direction are physically connected to each other. The two gates 405 arranged adjacent to each other in the second direction are mutually isolated from each other.

In some embodiments, a side of the gate 405 away from the gate oxide layer 404 is flush with a sidewall of a respective one of the plurality of second protective pillars 2212 away from the gate oxide layer.

Exemplarily, in the dry etching process, by controlling plasma to perform longitudinal etching, a portion of the gate conductive material is removed, so as to form the gate 405.

Since the first protective layer 221 is used as the mask layer, the side of the gate 405 away from the gate oxide layer 404 in the second direction is substantially flush with the sidewall of the respective one of the plurality of second protective pillars 2212 away from the gate oxide layer 404 in the extending direction of the second sub active pillar 403.

In the embodiments of the disclosure, since the second protective pillar formed through the spacer process may have further miniaturized size on the basis of the existing photolithography process, the first protective layer also has a further miniaturized size. Thus, by using the first protective layer as a mask, the gate with a smaller size and/or a smaller space between the gates can be formed. Meanwhile, by using the first protective layer as a mask, the operation of photolithography process can be reduced, thereby reducing the process cost and difficulty. Further, since the self-alignment second protective pillar is formed through the spacer process, the accuracy and process window of the alignment of the formed gate can be improved.

Figure 31:
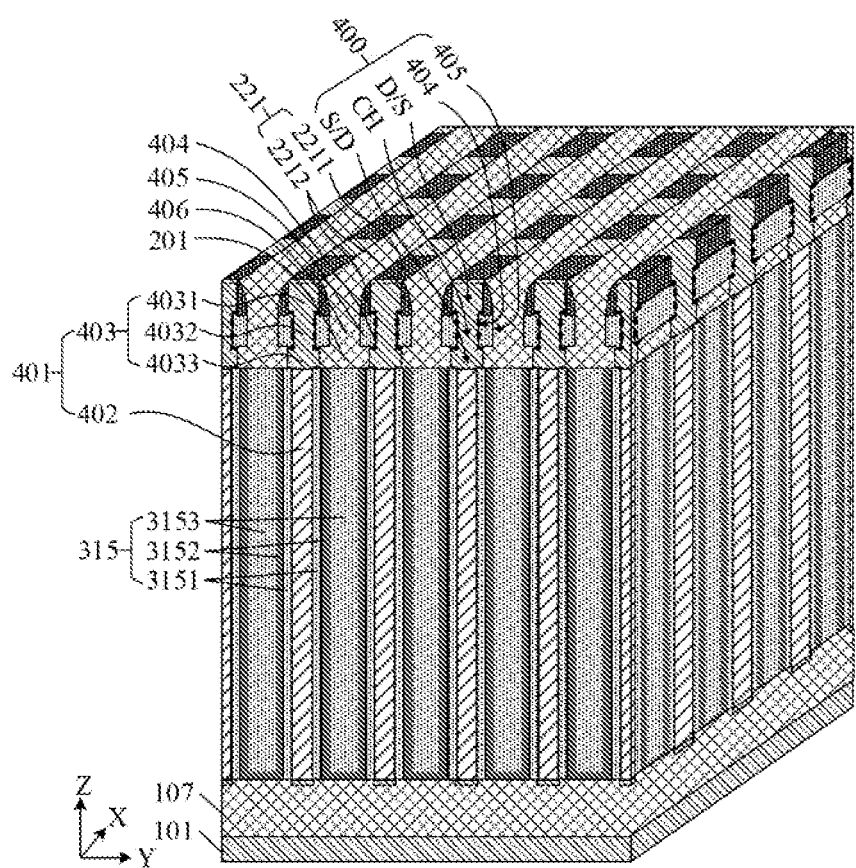

With reference to FIG. 31, the first insulation material is filled at least between two adjacent gates 405 through a PVD process, a CVD process, etc., so as to form a gate isolation structure 406. In the practical application, the first insulation material may also be filled in the gap of the first protective layer 221, so that the top surface of the first insulation material is flush with the top surface of the top portion 4031 of the second sub active pillar. The gates 405 in two adjacent rows of transistors 400 arrayed in the second direction are spaced apart from each other by the formed gate isolation structure 406.

It can be understood that, herein, each second sub active pillar 403 remains as a single part. The bottom portion 4033 of the second sub active pillar, the middle portion 4032 of the second sub active pillar and the top portion 4031 of the second sub active pillar in each second sub active pillar 403 are only configured to regionally divide the second sub active pillar 403 in the extending direction of the second sub active pillar 403. The middle portion 4032 of the second sub active pillar is configured to form the channel structure CH of the transistor 400, the top portion 4031 of the second sub active pillar is configured to form the drain D or the source S of the transistor 400, and the bottom portion 4033 of the second sub active pillar is configured to form the source S or the drain D of the transistor.

Figure 28:
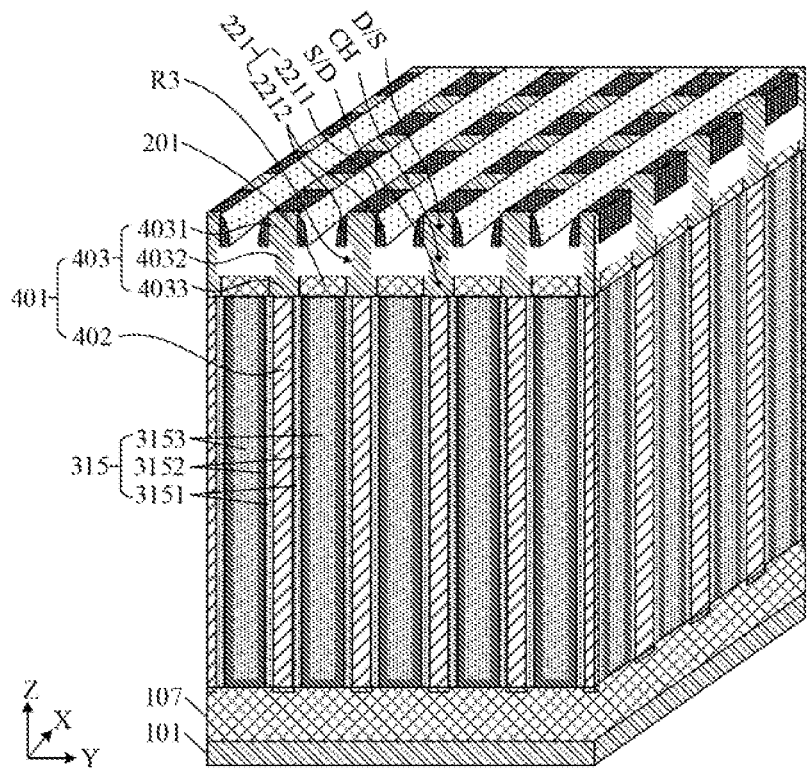

In some embodiments, with reference to FIG. 28, the sidewalls of the middle portions 4032 of the plurality of second sub active pillars is removed before the gate oxide layer is formed, so as to form the plurality of second sub active pillars 403 having recesses and to form a depressed space R3 corresponding to the recesses. With reference to FIG. 29, at least the gate oxide layer 404 arranged around the recesses is formed in depressed space R3.

Herein, the etching process used to form the second sub active pillars 403 having the recesses may include a wet etching process, a dry etching process, etc.

Exemplarily, the material of the surface layer of the middle portion 4032 of the second sub active pillar is isotropically removed through a wet etching process, so as to form the depressed space R3.

Herein, a diameter width of the middle portion 4032 of the second sub active pillar is less than a diameter width of the top portion 4031 of the second sub active pillar and/or a diameter width of the bottom portion 4033 of the second sub active pillar.

In the embodiments of the disclosure, the structure having the recess is formed on the middle portion of the second sub active pillar, so that more space may be reserved for the formation of the gate around the middle portion of the second sub active pillar in the subsequent process. More space means that the gate has more gate materials and lower resistance, so that the gate has better electrical performance.

With reference FIG. 30 and FIG. 31, the transistors 400 are formed. Each transistor includes: a gate oxide layer 404 arranged around the second sub active pillar, a gate 405 arranged around the gate oxide layer 404, and a source S arranged at an end of the second sub active pillar 403, and a drain D arranged on an opposite end of the second sub active pillar 403. A side of the gate 405 away from the gate oxide layer 404 is flush with the sidewall of a respective second protective pillar 2212 away from the gate oxide layer 404.

Herein, in different types of transistors, the shapes of the gates are different. Exemplarily, with reference to FIG. 31, in a pillar gate transistor, the gate is formed on one side of a channel area in the form of a pillar. In a gate semi-around transistor, the gate surrounds a half of the channel area. In a Gate All Around (GAA) transistor, the gate completely surrounds the channel area.

In the embodiments of the disclosure, the types of the transistor may include the above various types, which are not limited thereto. Preferably, with reference to FIG. 31, the type of the transistor is the GAA transistor 400.

It should be noted that, the gate structure here includes the gate (G) and the gate oxide layer. The gate oxide layer is arranged between the gate and the channel area, and is configured to electrically isolate the channel area from the gate, so as to reduce the hot carrier effect of the transistor.

Herein, a material of the gate may include metal and/or polycrystalline silicon (Poly), etc. A material of the gate oxide layer may include, but is not limited to, silicon oxide.

In some embodiments, a method for forming the gate includes, but is not limited to, a PVD process, a CVD process, an ALD process, etc. A method for forming the gate oxide layer includes, but is not limited to, an in-situ oxidation process.

A source is formed on an end of the second sub active pillar, and a drain is formed on an opposite end of the second sub active pillar.

In some specific embodiments, the method for forming the source and the drain includes, but is not limited to, an ion implantation process, a diffusion process, etc.

It should be noted that, the positions of the source and the drain at two opposite ends of the second sub active pillar may be interchanged. In the actual situation, the positions may be selected according to actual requirements.

It can be understood that, the memory in the above embodiments is of a Transistor on Capacitor (TOC) structure. This structure further includes a plurality of bit lines arranged on the transistor and in electric contact with the top portion of the second portion.

Therefore, in some embodiments, the method further includes the following operation. A plurality of bit lines BL are formed on the transistor.

Herein, a constituent material of the bit line BL includes at least one of cobalt, nickel, tungsten, tungsten nitride, titanium, titanium nitride, tantalum, tantalum nitride, copper, aluminum, aluminum copper, silver, or gold.

It can be understood that, the bit line BL is configured to perform a read or write operation on the transistor when the transistor is turned on.

Herein, the BL is arranged above the transistor and is configured as a metal BL, so that the resistance and the process difficulty may be reduced, which is a better match with the circuit design of the memory.

In above embodiments of the disclosure, the plurality of active pillars are formed on the substrate, each active pillar includes the first sub active pillar and the second sub active pillar arranged on the first sub active pillar. The first element is added into the first sub active pillar, so that the resistivity of the first sub active pillar containing the first element is less than the resistivity of the first sub active pillar absence of the first element. Then, the storage structure is formed on the sidewall of the first sub active pillar, and the channel structure of the transistor in the second sub active pillar is formed. In the embodiments of the disclosure, the resistivity of the first sub active pillar is reduced by adding the first element into the first sub active pillar, so that the resistance between the first sub active pillar and the storage structure can be reduced, thereby reducing the delay of signal transmission, and eventually improving the performance of the semiconductor structure. In addition, the storage structure and the transistor are formed on the same active pillar, so that the difficulty of aligning the memory cell with the transistor can be reduced, thereby reducing the process difficulty.

According to another aspect of the disclosure, an embodiment of the disclosure provides a semiconductor structure, which includes a substrate, a plurality of active pillars arranged above the substrate, a storage structure, and a plurality of transistors.

The plurality of active pillars are arranged in an array in a first direction and in a second direction. Each of the plurality of active pillars includes a first sub active pillar and a second sub active pillar arranged on the first sub active pillar. The first direction and the second direction intersect with each other and are both parallel to a top surface of the substrate. A material of the first sub active pillar includes a first element, and resistivity of the first sub active pillar containing the first element is less than resistivity of the first sub active pillar absence of the first element.

The storage structure covers a sidewall of the first sub active pillar.

A channel structure of each of the plurality of transistors is arranged in the second sub active pillar. An extending direction of the channel structure is the same as an extending direction of the second sub active pillar.

In some embodiments, the first element includes an N-type doped element or a P-type doped element, and the material of the first sub active pillar includes a semiconductor material. Alternatively, the first element includes a metal element, and the material of the first sub active pillar includes a compound of the metal element.

In some embodiments, the substrate includes an isolation structure. The plurality of active pillars are arranged on the isolation structure.

In some embodiments, the storage structure includes:
a first electrode layer covering the sidewall of the first sub active pillar;
a dielectric layer covering at least a sidewall of the first electrode layer; and
a second electrode layer arranged in a gap of the dielectric layer and covering a surface of the dielectric layer.

In some embodiments, the semiconductor structure further includes a first protective layer arranged around a sidewall of a top portion of the second sub active pillar.

The first protective layer includes a plurality of first protective pillars and a plurality of second protective pillars.

Each of the plurality of first protective pillars is arranged between the top portions of two second sub active pillars adjacent to each other in the first direction, and covers two opposite sidewalls of the two second sub active pillars adjacent to each other in the first direction.

Each of the plurality of second protective pillars extends in the first direction, covers the sidewall of the top portion of the second sub active pillar uncovered by a respective one of the plurality of first protective pillars, and covers a sidewall of the respective one of the plurality of first protective pillars.

In some embodiments, a diameter width of a middle portion of the second sub active pillar is less than a diameter width of the top portion of the second sub active pillar and/or a diameter width of a bottom portion of the second sub active pillar.

Each of the plurality of transistors includes: a gate oxide layer arranged around the second sub active pillar, a gate arranged around the gate oxide layer, a source arranged at an end of the second sub active pillar, and a drain arranged at an opposite end of the second sub active pillar. A side of the gate away from the gate oxide layer is flush with a sidewall of a respective one of the plurality of second protective pillars away from the gate oxide layer.

In some embodiments, the semiconductor structure further includes:
a plurality of bit lines arranged on the plurality of transistors and electrically connected to a top portion of the second sub active pillar.

The semiconductor structure provided in the embodiments of the disclosure is similar to the semiconductor structure manufactured by the method for manufacturing the semiconductor structure in the above embodiments. For technical features that are not disclosed in detail in the embodiments of the disclosure, refer to the above embodiments for understanding, which are not repeated herein.

According to a still another aspect of the disclosure, a memory is provided, which includes one or more semiconductor structures described in any one of the above embodiments.

Based on this, in the embodiments of the disclosure, the resistivity of the first sub active pillar is reduced by adding the first element into the first sub active pillar, so that the resistance between the first sub active pillar and the storage structure can be reduced, thereby reducing the delay of signal transmission, and eventually improving the performance of the semiconductor structure. In addition, the storage structure and the transistor are formed on the same active pillar, so that the difficulty of aligning the memory cell with the transistor can be reduced, thereby reducing the process difficulty.

In some embodiments, the memory includes a DRAM.

The features disclosed in several method or device embodiments provided in the disclosure can be combined arbitrarily without conflict to obtain a new method embodiment or device embodiment.

The above is merely specific implementations of the disclosure, and is not intended to limit the protection scope of the disclosure. It is easy for those skilled in the art to convince modifications or substitutions within the technical scope disclosed in the disclosure. These modifications or substitutions are within the protection scope of the disclosure. Therefore, the protection scope of the disclosure is subject to the protection scope of the claims.

The invention claimed is:

1. A semiconductor structure, comprising a substrate, a plurality of active pillars arranged above the substrate, a storage structure, and a plurality of transistors,
wherein the plurality of active pillars are arranged in an array in a first direction and in a second direction, each of the plurality of active pillars comprises a first sub active pillar and a second sub active pillar arranged on the first sub active pillar, the first direction and the second direction intersect with each other and are both parallel to a top surface of the substrate, a material of the first sub active pillar comprises a first element, and resistivity of the first sub active pillar comprising the first element is less than resistivity of the first sub active pillar absence of the first element;
wherein the storage structure covers a sidewall of the first sub active pillar;
wherein a channel structure of each of the plurality of transistors is arranged in the second sub active pillar, and an extending direction of the channel structure is the same as an extending direction of the second sub active pillar;
wherein the semiconductor structure further comprises a first protective layer arranged around a sidewall of a top portion of the second sub active pillar, and the first protective layer comprises a plurality of first protective pillars and a plurality of second protective pillars;
wherein each of the plurality of first protective pillars is arranged between the top portions of two second sub active pillars adjacent to each other in the first direction, and covers two opposite sidewalls of the two second sub active pillars adjacent to each other in the first direction; and
wherein each of the plurality of second protective pillars extends in the first direction, covers the sidewall of the top portion of the second sub active pillar uncovered by a respective one of the plurality of first protective pillars, and cover a sidewall of the respective one of the plurality of first protective pillars.

2. The semiconductor structure according to claim 1, wherein the first element comprises an N-type doped element or a P-type doped element, and the material of the first sub active pillar comprises a semiconductor material; or the first element comprises a metal element, and the material of the first sub active pillar comprises a compound of the metal element.

3. The semiconductor structure according to claim 1, wherein the substrate comprises an isolation structure, and the plurality of active pillars are arranged on the isolation structure.

4. The semiconductor structure according to claim 1, wherein the storage structure comprises:
a first electrode layer covering the sidewall of the first sub active pillar;
a dielectric layer covering at least a sidewall of the first electrode layer; and
a second electrode layer arranged in a gap of the dielectric layer and covering a surface of the dielectric layer.

5. The semiconductor structure according to claim 1, wherein a diameter width of a middle portion of the second sub active pillar is less than at least one of a diameter width of the top portion of the second sub active pillar or a diameter width of a bottom portion of the second sub active pillar; and
wherein each of the plurality of transistors comprises: a gate oxide layer arranged around the second sub active pillar, a gate arranged around the gate oxide layer, a source arranged at an end of the second sub active pillar, and a drain arranged at an opposite end of the second sub active pillar, wherein a side of the gate away from the gate oxide layer is flush with a sidewall of a respective one of the plurality second protective pillars away from the gate oxide layer.

6. The semiconductor structure according to claim 1, further comprising:
a plurality of bit lines arranged on the plurality of transistors and electrically connected to a top portion of the second sub active pillar.

7. A memory, comprising one or more semiconductor structures, each semiconductor structure comprising a substrate, a plurality of active pillars arranged above the substrate, a storage structure, and a plurality of transistors, wherein the plurality of active pillars are arranged in an array in a first direction and in a second direction, each of the plurality of active pillars comprises a first sub active pillar and a second sub active pillar arranged on the first sub active pillar, the first direction and the second direction intersect with each other and are both parallel to a top surface of the substrate, a material of the first sub active pillar comprises a first element, and resistivity of the first sub active pillar comprising the first element is less than resistivity of the first sub active pillar absence of the first element;

wherein the storage structure covers a sidewall of the first sub active pillar;

wherein a channel structure of each of the plurality of transistors is arranged in the second sub active pillar, and an extending direction of the channel structure is the same as an extending direction of the second sub active pillar;

wherein each semiconductor structure further comprises a first protective layer arranged around a sidewall of a top portion of the second sub active pillar, and the first protective layer comprises a plurality of first protective pillars and a plurality of second protective pillars;

wherein each of the plurality of first protective pillars is arranged between the top portions of two second sub active pillars adjacent to each other in the first direction, and covers two opposite sidewalls of the two second sub active pillars adjacent to each other in the first direction; and wherein each of the plurality of second protective pillars extends in the first direction, covers the sidewall of the top portion of the second sub active pillar uncovered by a respective one of the plurality of first protective pillars, and cover a sidewall of the respective one of the plurality of first protective pillars.

8. A method for manufacturing a semiconductor structure, comprising:

providing a substrate, and forming, on the substrate, a plurality of active pillars arranged in an array in a first direction and in a second direction, wherein each of the plurality of active pillars comprises a first sub active pillar and a second sub active pillar arranged on the first sub active pillar, and the first direction and the second direction intersect with each other and are both parallel to a top surface of the substrate;

adding a first element into the first sub active pillar, wherein resistivity of the first sub active pillar comprising the first element is less than resistivity of the first sub active pillar absence of the first element;

forming a storage structure at least on a sidewall of the first sub active pillar; and forming a plurality of transistors, wherein a channel structure of each of the plurality of transistors is arranged in the second sub active pillar, and an extending direction of the channel structure is the same as an extending direction of the second sub active pillar;

wherein forming, on the substrate, the plurality of active pillars arranged in an array in the first direction and in the second direction comprises:

forming, on the substrate, a plurality of semiconductor pillars arranged in an array in the first direction and in the second direction, wherein each of the plurality of semiconductor pillars comprises a first portion, a second portion arranged on the first portion, and a third portion arranged on the second portion;

forming a support layer covering a top surface of the third portion;

forming a second protective layer covering at least a sidewall of the third portion;

oxidizing each of the plurality of semiconductor pillars to completely oxidize the first portion into an oxidation pillar, and to oxidize a surface of the second portion into an oxide layer;

removing the oxide layer on the surface of the second portion to form the first sub active pillar; and after forming the storage structure, removing the support layer and the second protective layer to form the second sub active pillar.

9. The method for manufacturing the semiconductor structure according to claim 8, wherein the first element comprises an N-type doped element or a P-type doped element, and wherein adding the first element into the first sub active pillar comprises: adding the N-type doped element or the P-type doped element into the first sub active pillar through a diffusion process or an ion implantation process;

or wherein the first element comprises a metal element, and wherein adding the first element into the first sub active pillar comprises: forming a metal layer comprising the metal element and covering the sidewall of the first sub active pillar; and reacting the metal layer with the first sub active pillar through an annealing process to form a metal compound.

10. The method for manufacturing the semiconductor structure according to claim 8, wherein forming, on the substrate, the plurality of semiconductor pillars arranged in an array in the first direction and in the second direction comprises:

providing a semiconductor base;

forming, in the base, a plurality of first trenches spaced apart from each other and arrayed in the first direction and a plurality of second trenches spaced apart from each other and arrayed in the second direction; and expanding at least one of a bottom portion of each of the plurality of first trenches or a bottom portion of each of the plurality of second trenches to form the plurality of semiconductor pillars.

11. The method for manufacturing the semiconductor structure according to claim 8, wherein forming the support layer comprises:

filling a first insulation material between the plurality of semiconductor pillars to form a first insulation layer;

depositing a second insulation material covering a top surface of the first insulation layer and covering top surfaces of the plurality of semiconductor pillars to form a second insulation layer;

removing a portion of the second insulation layer in the second direction to form a plurality of first shallow trenches, wherein a bottom surface of each of the plurality of first shallow trenches is flush with the top surface of each of the plurality of semiconductor pillars;

filling the first insulation material in the plurality of first shallow trenches;

removing a portion of the second insulation layer in the first direction to form a plurality of second shallow trenches, wherein a bottom surface of each of the plurality of second shallow trenches is flush with the top surface of each of the plurality of semiconductor pillars, and the plurality of second shallow trenches expose the top surfaces of the plurality of semiconductor pillars; and filling the second insulation material in the plurality of second shallow trenches, wherein a remaining portion of the second insulation layer and the plurality of second shallow trenches filled with the second insulation material collectively form the support layer.

12. The method for manufacturing the semiconductor structure according to claim 11, wherein forming the second protective layer comprises:

removing a portion of the first insulation material to form a plurality of third shallow trenches, wherein a bottom surface of each of the plurality of third shallow trenches is flush with a bottom surface of the third portion, and each of the plurality of third shallow trenches exposes the sidewall of the third portion; and depositing a sacrificial material covering at least the sidewall of the third portion, to form the second protective layer.

13. The method for manufacturing the semiconductor structure according to claim 8, wherein forming the storage structure at least on the sidewall of the first sub active pillar comprises:

forming a first conductive layer covering the sidewall of the first sub active pillar;

forming a dielectric layer covering at least a sidewall of the first conductive layer; and forming a second conductive layer in a gap of the dielectric layer.

14. The method for manufacturing the semiconductor structure according to claim 8, wherein after forming the storage structure, the method further comprises: forming a first protective layer arranged around a sidewall of a top portion of the second sub active pillar, wherein forming the first protective layer comprises:

forming a first insulation material between a plurality of the second sub active pillars;

removing a portion of the first insulation material on the top portions of the plurality of second sub active pillars to form a plurality of first grooves, wherein each of the plurality of first grooves exposes two opposite sidewalls of the top portions of two second sub active pillars adjacent to each other in the first direction;

filling the plurality of first grooves to form a plurality of first protective pillars;

removing a remaining portion of the first insulation material on the top portions of the plurality of second sub active pillars to form a plurality of second grooves extending in the first direction; and forming a plurality of second protective pillars on sidewalls of the plurality of second grooves, wherein the plurality of first protective pillars and the plurality of second protective pillars collectively form the first protective layer.

15. The method for manufacturing the semiconductor structure according to claim 14, wherein forming the plurality of transistors comprises:

after forming the first protective layer, removing the first insulation material corresponding to middle portions of the plurality of second sub active pillars to expose sidewalls of the middle portions of the plurality of second sub active pillars;

forming a gate oxide layer covering the sidewall of the middle portion of each of the plurality of second sub active pillars;

forming a gate covering the gate oxide layer;

forming a source at a bottom portion of each of the plurality of second sub active pillars, and forming a drain at the top portion of each of the plurality of second sub active pillars; and forming a plurality of gate isolation structures between the plurality of second protective pillars and between a plurality of gates.

16. The method for manufacturing the semiconductor structure according to claim 15, wherein forming the gate covering the gate oxide layer comprises:

filling a gate conductive material in a gap of the gate oxide layer; and removing a portion of the gate conductive material by using the first protective layer as a mask layer, wherein a remaining portion of the gate conductive material forms the gate.

17. The method for manufacturing the semiconductor structure according to claim 15, wherein before forming the gate oxide layer, the method further comprises: removing the sidewalls of the middle portions of the plurality of second sub active pillars to form the plurality of second sub active pillars having recesses and to form a depressed space corresponding to the recesses; and forming, in the depressed space, at least the gate oxide layer arranged around the recesses.

* * * * *